(12) United States Patent
Ikeda et al.

(10) Patent No.: US 12,278,245 B2
(45) Date of Patent: Apr. 15, 2025

(54) DISPLAY DEVICE

(71) Applicant: Semiconductor Energy Laboratory Co., Ltd., Atsugi (JP)

(72) Inventors: Takayuki Ikeda, Atsugi (JP); Hitoshi Kunitake, Isehara (JP); Koji Kusunoki, Isehara (JP); Yoshiaki Oikawa, Atsugi (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 548 days.

(21) Appl. No.: 17/626,307

(22) PCT Filed: Jul. 10, 2020

(86) PCT No.: PCT/IB2020/056495
§ 371 (c)(1),
(2) Date: Jan. 11, 2022

(87) PCT Pub. No.: WO2021/014264
PCT Pub. Date: Jan. 28, 2021

(65) Prior Publication Data
US 2022/0278139 A1 Sep. 1, 2022

(30) Foreign Application Priority Data

Jul. 19, 2019 (JP) .................. 2019-133349
Jul. 26, 2019 (JP) .................. 2019-137417
Aug. 1, 2019 (JP) .................. 2019-142204

(51) Int. Cl.
*H01Q 1/24* (2006.01)
*H01L 27/12* (2006.01)
(Continued)

(52) U.S. Cl.
CPC ......... *H01L 27/1255* (2013.01); *H01Q 1/243* (2013.01); *H04M 1/0268* (2013.01);
(Continued)

(58) Field of Classification Search
CPC . H01Q 1/243; H01Q 1/38; H01Q 9/36; H01L 27/1225
See application file for complete search history.

(56) References Cited

U.S. PATENT DOCUMENTS

| 10,204,535 B2 | 2/2019 | Yamazaki |
| 2001/0035713 A1 | 11/2001 | Kimura |

(Continued)

FOREIGN PATENT DOCUMENTS

| CN | 106125970 A | 11/2016 |
| CN | 107667428 A | 2/2018 |

(Continued)

OTHER PUBLICATIONS

International Search Report (Application No. PCT/IB2020/056495) Dated Oct. 6, 2020.

(Continued)

*Primary Examiner* — Walter H Swanson
*Assistant Examiner* — Jacob T Nelson
(74) *Attorney, Agent, or Firm* — Eric J. Robinson; Robinson Intellectual Property Law Office, P.C.

(57) ABSTRACT

A display device with a novel structure is provided. The display device includes a first substrate provided with a plurality of pixels including a display element, and a second substrate including a first conductive layer provided with a plurality of first openings. The first conductive layer has a function of an antenna capable of transmitting and receiving a radio signal. The pixel and the first opening include a region where the pixel and the first opening overlap with each other. The second substrate includes an element layer. The element layer includes a transistor. The transistor has a function of an amplifier capable of amplifying the radio signal. The transistor each includes a semiconductor layer (Continued)

including a metal oxide in a channel formation region. The metal oxide contains In, Ga, and Zn.

6 Claims, 21 Drawing Sheets

(51) Int. Cl.
*H04M 1/02* (2006.01)
*H10K 59/00* (2023.01)
*H10K 59/40* (2023.01)
*H10K 59/131* (2023.01)

(52) U.S. Cl.
CPC ............ *H10K 59/00* (2023.02); *H10K 59/40* (2023.02); *H01L 27/1225* (2013.01); *H01L 27/1266* (2013.01); *H04M 2250/22* (2013.01); *H10K 59/131* (2023.02)

(56) References Cited

U.S. PATENT DOCUMENTS

| | | | |
|---|---|---|---|
| 2003/0230763 A1 | 12/2003 | Kimura et al. | |
| 2005/0142896 A1 | 6/2005 | Imai et al. | |
| 2005/0192129 A1 | 9/2005 | Kuwabara | |
| 2006/0244741 A1 | 11/2006 | Kimura et al. | |
| 2007/0065957 A1 | 3/2007 | Fujii et al. | |
| 2008/0042180 A1* | 2/2008 | Yamazaki | H10K 19/10 257/306 |
| 2009/0001469 A1 | 1/2009 | Yoshida et al. | |
| 2010/0201661 A1 | 8/2010 | Kimura et al. | |
| 2011/0102696 A1 | 5/2011 | Yamazaki et al. | |
| 2011/0128461 A1 | 6/2011 | Koyama et al. | |
| 2014/0184968 A1 | 7/2014 | Niikura et al. | |
| 2015/0255518 A1 | 9/2015 | Watanabe et al. | |
| 2016/0274398 A1* | 9/2016 | Hirakata | G06F 3/0446 |
| 2016/0274421 A1 | 9/2016 | Hirakata | |
| 2016/0300853 A1 | 10/2016 | Yamazaki | |
| 2016/0328051 A1 | 11/2016 | Shishido et al. | |
| 2016/0328057 A1 | 11/2016 | Chai et al. | |
| 2016/0351634 A1 | 12/2016 | Lim et al. | |
| 2017/0250383 A1 | 8/2017 | Goto et al. | |
| 2018/0188432 A1 | 7/2018 | Choi et al. | |
| 2018/0196322 A1 | 7/2018 | Yamazaki et al. | |
| 2018/0203319 A1 | 7/2018 | Yamazaki et al. | |
| 2020/0033968 A1 | 1/2020 | Yamagishi et al. | |
| 2020/0053879 A1 | 2/2020 | Suto | |
| 2020/0343314 A1 | 10/2020 | Nakamura et al. | |

FOREIGN PATENT DOCUMENTS

| | | |
|---|---|---|
| CN | 108268172 A | 7/2018 |
| CN | 109791452 A | 5/2019 |
| CN | 110115115 A | 8/2019 |
| EP | 3098699 A | 11/2016 |
| EP | 3573435 A | 11/2019 |
| JP | 2000-138512 A | 5/2000 |
| JP | 2016-197238 A | 11/2016 |
| JP | 6519711 | 5/2019 |
| KR | 2016-0140306 A | 12/2016 |
| KR | 2018-0078860 A | 7/2018 |
| KR | 2019-0082266 A | 7/2019 |
| TW | 201832623 | 9/2018 |
| WO | WO-2016/190648 | 12/2016 |
| WO | WO-2017/026590 | 2/2017 |
| WO | WO-2018/062245 | 4/2018 |
| WO | WO-2018/135519 | 7/2018 |
| WO | WO-2019/138565 | 7/2019 |

OTHER PUBLICATIONS

Written Opinion (Application No. PCT/IB2020/056495) Dated Oct. 6, 2020.

* cited by examiner

DISPLAY DEVICE

TECHNICAL FIELD

This specification describes a display device or the like. In addition, in this specification, a display device generally means a device that has a display function.

BACKGROUND ART

With the progress of information technology such as IoT (Internet of Things), the amount of transmitted and received data has been increasing. To deal with the increasing amount of data, a new communication standard called fifth generation mobile communication system (5G), which achieves higher communication speed, more simultaneous connections, and shorter delay time than the fourth generation mobile communication system (4G), has been considered (refer to Patent Document 1, for example). In Japan, 5G uses communication frequencies of a 3.7 GHz band, a 4.5 GHz band, and a 28 GHz band.

As the communication frequency increases, the amount of information that can be transmitted and received increases, whereas the communication distance decreases. In tackling short communication distances, a beamforming technique with antennas arranged in an array is effective. For example, a structure in which antennas are arranged at intervals of approximately 5 mm, which corresponds to ½ wavelength of the communication frequency, is effective in Japan.

REFERENCE

Patent Document

[Patent Document 1] PCT International Publication No. 2017/026590

SUMMARY OF THE INVENTION

Problems to be Solved by the Invention

For a display device such as a smartphone which performs mobile communication and the like, a reduction in size of an integrated circuit (IC) including antennas is required. Placement of a plurality of antennas in an electronic device that performs mobile communication and the like in accordance with the 5G communication standard has a trade-off relationship with a demand for smaller integrated circuits. It has been difficult to achieve both of a structure where antennas are placed at regular intervals and a structure with a downsized integrated circuit.

An object of one embodiment of the present invention is to provide a novel display device or the like. Another object of one embodiment of the present invention is to provide a display device or the like with a novel structure in which both of a structure where antennas are placed next to each other and a structure with a downsized integrated circuit can be achieved.

The description of a plurality of objects does not preclude the existence of each object. One embodiment of the present invention does not necessarily achieve all the objects described as examples. Furthermore, objects other than those listed are apparent from description of this specification, and such objects can be objects of one embodiment of the present invention.

Means for Solving the Problems

One embodiment of the present invention is a display device including a first substrate provided with a plurality of pixels including a display element, and a second substrate including a first conductive layer provided with a plurality of first openings. The first conductive layer has a function of an antenna capable of transmitting and receiving a radio signal. The pixel and the first opening include a region where the pixel and the first opening overlap with each other.

One embodiment of the present invention is a display device including a first substrate provided with a plurality of pixels including a display element, and a second substrate including a first conductive layer provided with a plurality of first openings and an element layer including a transistor. The first conductive layer has a function of an antenna capable of transmitting and receiving a radio signal. The transistor has a function of an amplifier capable of amplifying the radio signal. The pixel and the first opening include a region where the pixel and the first opening overlap with each other.

One embodiment of the present invention is a display device including a first substrate provided with a plurality of pixels including a display element, and a second substrate including a first conductive layer provided with a plurality of first openings, a second conductive layer provided with a plurality of second openings, and an element layer including a transistor. The first conductive layer has a function of an antenna capable of transmitting and receiving a radio signal. The transistor has a function of an amplifier capable of amplifying the radio signal. The pixel, the first opening, and the second opening include a region where the pixel, the first opening, and the second opening overlap with each other.

In one embodiment of the present invention, a display device in which the second conductive layer functions as an electrode of a touch sensor is preferable.

In one embodiment of the present invention, a display device in which the transistor includes a semiconductor layer including a metal oxide in a channel formation region is preferable.

In one embodiment of the present invention, a display device in which the metal oxide contains In, Ga, and Zn is preferable.

In one embodiment of the present invention, a display device in which the transistor includes a region where the transistor and the first conductive layer overlap with each other is preferable.

In one embodiment of the present invention, a display device in which the first conductive layer includes a third conductive layer having a function of an antenna capable of transmitting and receiving a first radio signal and a fourth conductive layer having a function of an antenna capable of transmitting and receiving a second radio signal, and the shape of the third conductive layer is different from the shape of the fourth conductive layer is preferable.

In one embodiment of the present invention, a display device in which the second substrate is a glass substrate is preferable.

In one embodiment of the present invention, a display device in which the second substrate is a flexible substrate is preferable.

Note that other embodiments of the present invention will be shown in the description of the following embodiments and the drawings.

Effect of the Invention

One embodiment of the present invention can provide a novel display device or the like. Another embodiment of the present invention can provide a display device or the like with a novel structure in which both of a structure where antennas are placed next to each other and a structure with a downsized integrated circuit can be achieved.

The description of a plurality of effects does not preclude the existence of other effects. One embodiment of the present invention does not have to achieve all the effects described as examples. In one embodiment of the present invention, other objects, effects, and novel features are apparent from the description of this specification and the drawings.

MODE FOR CARRYING OUT THE INVENTION

Figure 1A:
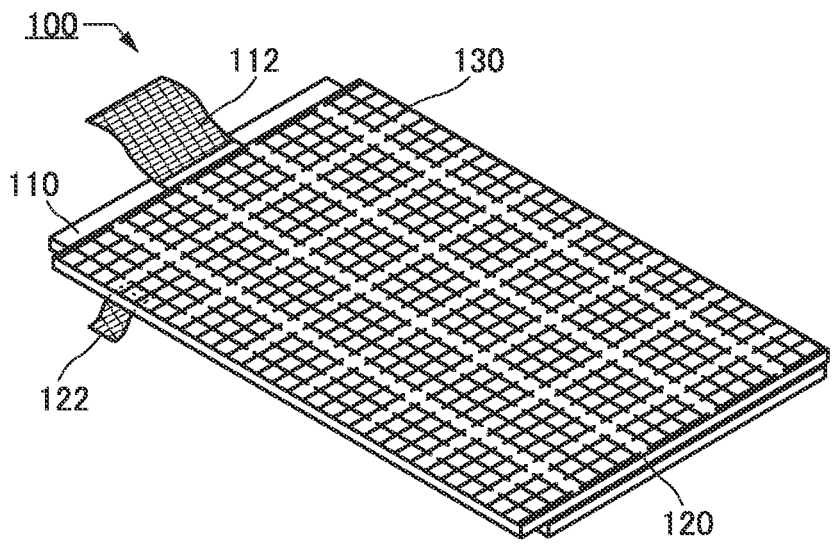
FIGS. 1A and 1B are diagrams illustrating a structure example of a display device.

Embodiments of the present invention will be described below. Note that one embodiment of the present invention is not limited to the following description, and it will be readily appreciated by those skilled in the art that modes and details of the present invention can be modified in various ways without departing from the spirit and scope of the present invention. One embodiment of the present invention therefore should not be construed as being limited to the following description of the embodiments.

Note that ordinal numbers such as "first", "second", and "third" in this specification and the like are used in order to avoid confusion among components. Thus, the terms do not limit the number of components. In addition, the terms do not limit the order of components. In this specification and the like, for example, a "first" component in one embodiment can be referred to as a "second" component in other embodiments or claims. Furthermore, in this specification and the like, for example, a "first" component in one embodiment can be omitted in other embodiments or claims.

The same components, components having similar functions, components made of the same material, components formed at the same time, and the like in the drawings are denoted by the same reference numerals, and repetitive description thereof is skipped in some cases.

In this specification, a power supply potential VDD may be abbreviated to a potential VDD, VDD, or the like, for example. The same applies to other components (e.g., a signal, a voltage, a circuit, an element, an electrode, a wiring, and the like).

Moreover, when a plurality of components are denoted by the same reference numeral and, in particular, need to be distinguished from each other, an identification sign such as "_1", "_2", "[n]", or "[m,n]" is sometimes added to the reference numeral. For example, the second wiring GL is referred to as a wiring GL[2].

Embodiment 1

Structure examples of a display device of one embodiment of the present invention will be described with reference to FIG. 1A to FIG. 10E.

In this specification and the like, a structure in which a connector such as an FPC (Flexible Printed Circuit) or a TCP (Tape Carrier Package) is attached to a substrate included in a display device, or a structure in which an IC (integrated circuit) is directly mounted on a substrate included in a display device by a COG (Chip On Glass) method is referred to as a display device or a display module, in some cases.

FIG. 1A is a schematic diagram for illustrating the external appearance of a display device 100 of one embodiment of the present invention. The display device of one embodiment of the present invention has a structure in which a display element and a conductive layer forming an antenna are provided between a pair of substrates. The display device of one embodiment of the present invention enables a plurality of antennas to be placed to overlap with a display unit.

The display device 100 includes a substrate 110 provided with the display element, and a substrate 120 provided with the conductive layer. The substrate 110 includes an FPC 112 to which a signal or the like for displaying an image is input. The substrate 120 includes an FPC 122 for transmitting and receiving a signal.

The substrate 120 includes the conductive layer processed into a desired shape. The conductive layer functions as an antenna 130. The conductive layer each preferably has an opening. The opening and the display element are placed to overlap with each other. With this structure, light from the display element is emitted to the outside through the opening, and therefore, the conductive layer functioning as an antenna is not required to have a light-transmitting property. That is, a material such as a metal or alloy that has lower resistance than a light-transmitting conductive material can be used as a material for the conductive layer functioning as an antenna. This enables transmission and receipt of radio signals with an antenna with reduced effects of wiring resistance and the like.

In addition, since a low-resistance material can be used for the conductive layer, the conductive layer can have an extremely small line width. That is, the surface area of the conductive layer when seen from the display surface side (in a plan view) can be reduced. As a result, the influence of noise caused by driving a pixel can be suppressed. Furthermore, the influence of noise can be suppressed even in a structure where the conductive layer functioning as an antenna and the display element included in the pixel are placed close to each other between two substrates. Thus, the thickness of the display device can be reduced. In particular, in the case where a flexible material is used for the pair of substrates, a thin, lightweight, flexible display device can be obtained.

The conductive layer provided on the substrate 120 has a mesh shape with a plurality of openings. The material of the conductive layer used as the antenna 130 is preferably a material with a low resistance value, for example. A metal such as silver, copper, or aluminum may be used, as an example. Furthermore, a metal nanowire including a number of conductors which are extremely thin (with a diameter of several nanometers, for example) may be used. As an example, an Ag nanowire, a Cu nanowire, an Al nanowire, or the like may be used. With an Ag nanowire, for example, a light transmittance of 89% or more and a sheet resistance value of greater than or equal to 40 $\Omega$/square and less than or equal to 100 $\Omega$/square can be achieved. Note that because such a metal nanowire provides high transmittance, the metal nanowire may be used for an electrode of the display element, e.g., a pixel electrode or a common electrode. Alternatively, a carbon nanotube may be used as a material of the conductive layer used as the antenna 130.

Figure 1B:
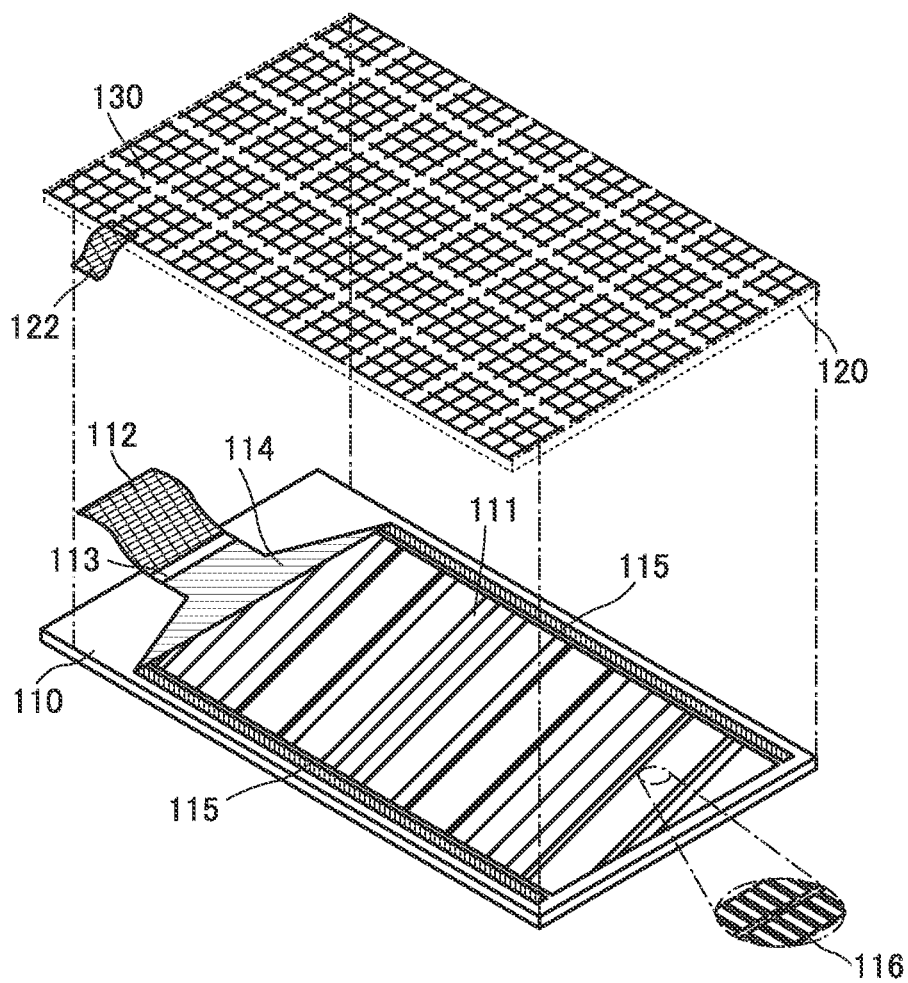

FIG. 1B is a schematic view for illustrating a structure on the substrate 110 side of the display device 100 of one embodiment of the present invention. The substrate 110 includes a display unit 111. The display unit 111 includes a plurality of pixels 116 arranged in a matrix. The pixels 116 each preferably includes a plurality of sub-pixels. Each sub-pixel includes a display element. A circuit 115 electrically connected to the pixels 116 in the display unit 111 is also provided over the substrate 110. As the circuit 115, a circuit functioning as a gate driver circuit can be used, for example. The FPC 112 has a function of supplying a signal from the outside to at least one of the display unit 111 and the circuit 115 via a wiring 114. An IC 113 functioning as a source driver circuit is preferably mounted on the substrate 110 or the FPC 112. The IC 113 can be mounted on the substrate 110 by a COG method or a COF (Chip On Film) method.

Examples of the display element that can be used for the display device include a liquid crystal element, an organic EL element, an inorganic EL element, an LED element, a microcapsule, an electrophoretic element, an electrowetting element, an electrofluidic element, an electrochromic element, and a MEMS element.

A touch panel having a touch sensor function can be used as the display device. In that case, the IC 113 includes a touch sensor controller, a sensor driver, and the like. As the touch panel, an on-cell touch panel or an in-cell touch panel in which the display device and a touch sensor are combined is preferable. The on-cell or in-cell touch panel can be thin and lightweight. The on-cell or in-cell touch panel has fewer components and can therefore reduce cost. For the touch panel, an optical touch sensor or a capacitive touch sensor can be used.

Figure 2A:
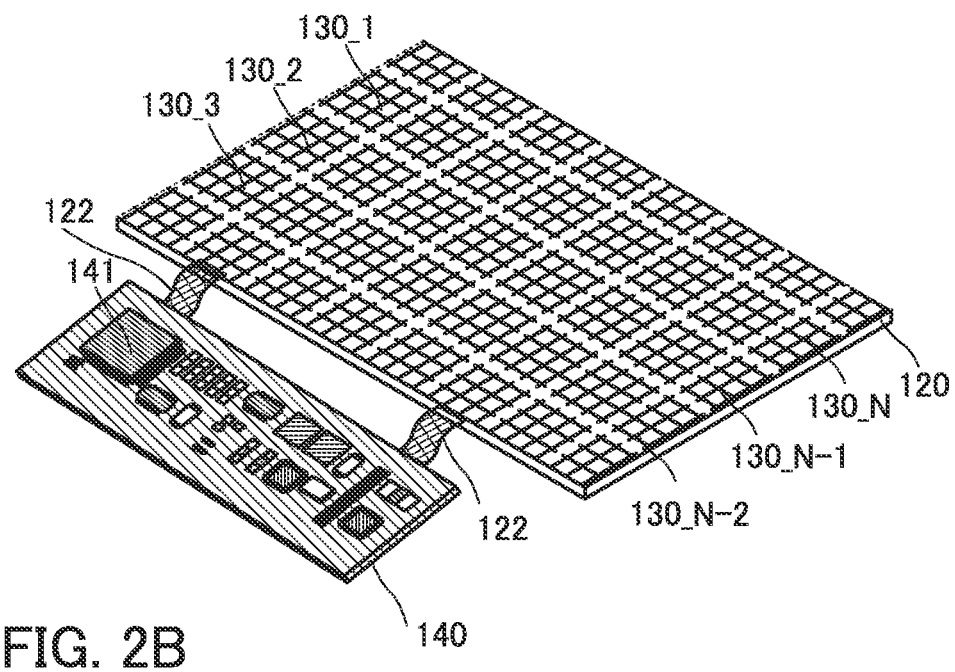
FIGS. 2A and 2B are diagrams illustrating a structure example of a display device.

FIG. 2A is a schematic view for illustrating a structure of the substrate 120 side of the display device 100 of one embodiment of the present invention. The substrate 120 includes the conductive layer processed into a desired shape. The processed conductive layer functions as an antenna. As shown in FIG. 2A, a plurality of antennas 130_1 to 130_N can be provided over the substrate. The FPC 122 has a function of a wiring making electrical connection between the plurality of antennas 130_1 to 130_N and an integrated circuit 141 provided on a substrate 140.

In one embodiment of the present invention, the antennas 130_1 to 130_N can be placed over the substrate 120. The plurality of antennas 130_1 to 130_N can be placed next to each other over the region equivalent to the display unit 111 including the pixels 116. The plurality of antennas 130_1 to 130_N can be placed next to each other over the entire surface of the substrate 120, which is larger than the region of the substrate 140. The plurality of antennas 130_1 to 130_N can be placed next to each other, and antennas with different shapes or antennas with different sizes can be placed next to each other. In addition, since the antennas can be provided in the region that corresponds to the display unit, the structure where the plurality of antennas are placed next to each other and the structure where the integrated circuit is downsized can be both achieved in the display device.

Antennas with different shapes or antennas with different sizes can be placed, which enables transmission and receipt of radio signals with different frequencies. In addition, a plurality of antennas with the same shape and the same size can be placed, which enables beamforming technology with antennas arranged in an array to be used. Since the beamforming technology enables antenna directionality, radio wave propagation loss caused when communication frequency increases can be compensated for.

When placing the antennas 130_1 to 130_N, for example, a structure in which the antennas are arranged at intervals of approximately 5 mm, which corresponds to ½ wavelength of the communication frequency, is effective. It is preferable to place a conductive layer not functioning as an antenna between the antennas 130_1 to 130_N. Placing a conductive layer not functioning as an antenna between adjacent antennas can improve the coverage with a thin film formed after the formation of the conductive layer and make the surface flat. In addition, owing to the uniform thickness of the layer including the conductive layers, luminance unevenness of light emitted from the pixels through the layer can be reduced, so that the display device with improved display quality can be obtained. Note that the conductive layer not functioning as an antenna may be used as an electrode of the touch sensor. The frequency of a signal used in the touch sensor is different from the frequency of a signal used in wireless communication, which enables separation of signals.

Figure 2B:
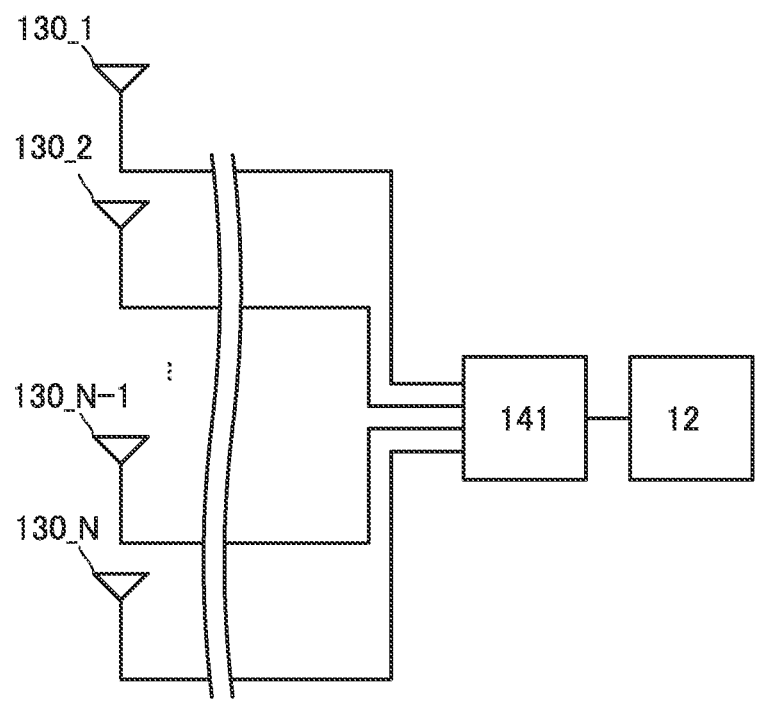

FIG. 2B shows the integrated circuit 141 and a baseband processor 12, in addition to the plurality of antennas 130_1 to 130_N shown in FIG. 2A.

The integrated circuit 141 has a function of performing modulation processing or demodulation processing on data of a radio signal that is transmitted to or received by the antennas 130_1 to 130_N. Specifically, the integrated circuit 141 has a function of generating a transmission signal by performing modulation processing using a carrier wave on the transmission data received from the baseband processor 12 and outputting the transmission signal via the antennas 130_1 to 130_N. In addition, the integrated circuit 141 has a function of receiving a reception signal via the antennas 130_1 to 130_N, generating reception data by performing demodulation processing using a carrier wave on the reception signal, and transmitting the reception data to the baseband processor 12. The integrated circuit 141 may include a duplexer connected to each of the antennas 130_1 to 130_N.

The baseband processor 12 has a function of performing baseband processing including encoding (e.g., error correction encoding) processing, decoding processing, or the like on data that is transmitted to or received by an external device via the antennas 130_1 to 130_N. Specifically, the baseband processor 12 has a function of receiving transmission data from the application processor, performing encoding processing on the received transmission data, and transmitting the data to the integrated circuit 141. In addition, the baseband processor 12 has a function of receiving reception data from the integrated circuit 141, performing decoding processing on the received reception data, and transmitting the data to the application processor.

Figure 3A:
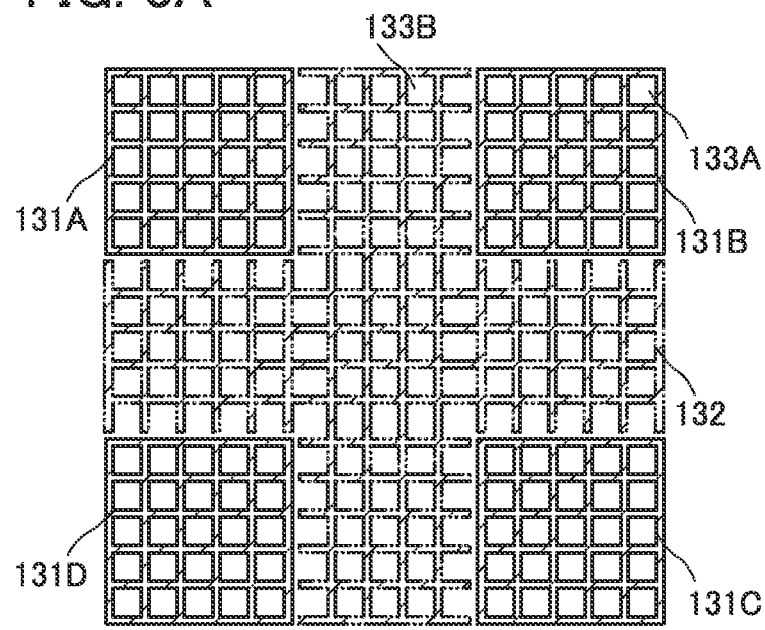
FIGS. 3A and 3B are diagrams illustrating a structure example of a display device.

FIG. 3A shows a layout diagram of conductive layers 131A to 131D which can be used as the antennas 130_1 to 130_N illustrated in FIG. 2A and a conductive layer 132 provided between the antennas. In the conductive layers 131A to 131D, an opening 133A for letting light from the pixels to pass through is shown. In the conductive layer 132, an opening 133B for letting light from the pixels to pass through is shown.

The conductive layers 131A to 131D functioning as antennas are provided apart from the conductive layer 132 not functioning as an antenna. The opening 133A and the opening 133B are provided in a region overlapping with pixels included in the display unit. This structure allows light from the display element to be emitted to the outside through the opening 133A and the opening 133B; thus, the conductive layers 131A to 131D are not required to have a light-transmitting property. That is, a material such as a metal or alloy that has lower resistance than a light-transmitting conductive material can be used as a material for the conductive layers functioning as antennas.

Figure 3B:
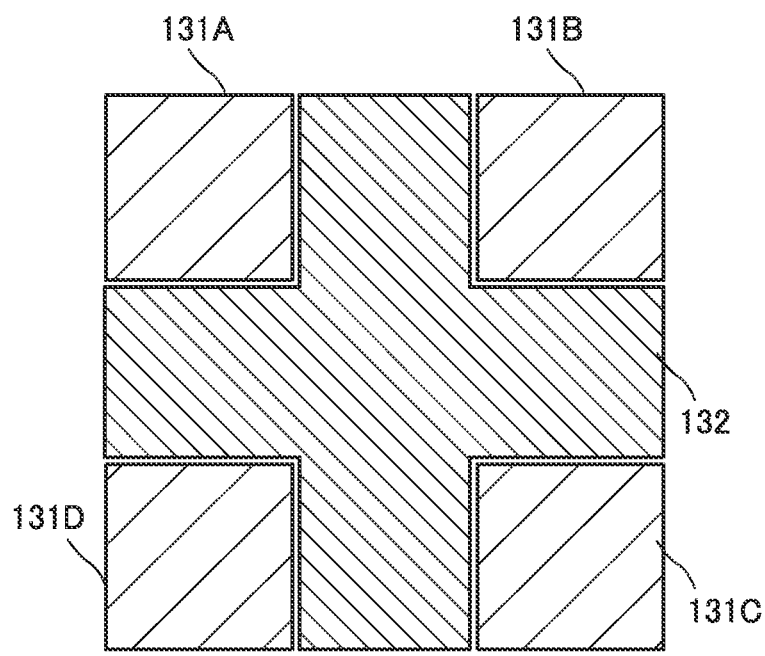

FIG. 3B is a schematic diagram that shows the layout diagram illustrated in FIG. 3A in a block diagram on a region-by-region basis. As in FIG. 3A, FIG. 3B shows the conductive layers 131A to 131D and the conductive layer 132.

As shown in FIGS. 3A and 3B, the conductive layers functioning as antennas are arranged in a regular pattern with the conductive layer not functioning as an antenna provided therebetween, thereby enabling a structure in which antennas are arranged at intervals of approximately 5 mm, which corresponds to ½ wavelength of the communication frequency, for example. Thus, the beamforming technology with antennas arranged in an array can be used. Since the beamforming technology enables antenna directionality, radio wave propagation loss caused when communication frequency increases can be compensated for.

Furthermore, arranging the conductive layers functioning as antennas in a regular pattern with the conductive layer not functioning as an antenna provided therebetween as shown in FIGS. 3A and 3B can improve the coverage with a thin film formed after the formation of the conductive layers and make the surface flat. Owing to the uniform thickness of the layer including the conductive layers, luminance unevenness of light emitted from the pixels through the layer can be reduced, so that the display device with improved display quality can be obtained. Although a structure example in which the conductive layers 131A to 131D are arranged in a regular pattern in square shapes is shown in FIGS. 3A and 3B, one embodiment of the present invention is not limited thereto. The shapes of the conductive layers 131A to 131D may be circles, triangles, pentagons, hexagons, octagons, or the like.

Figure 4A:
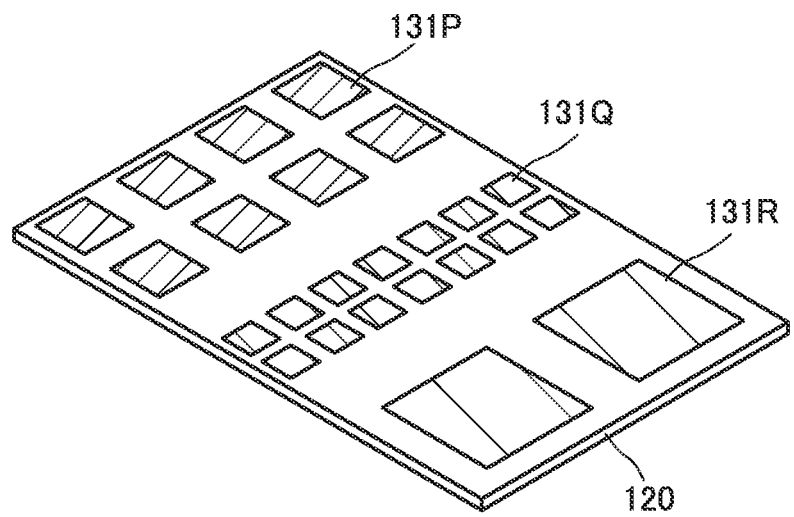
FIGS. 4A and 4B are diagrams illustrating a structure example of a display device.
Figure 4B:
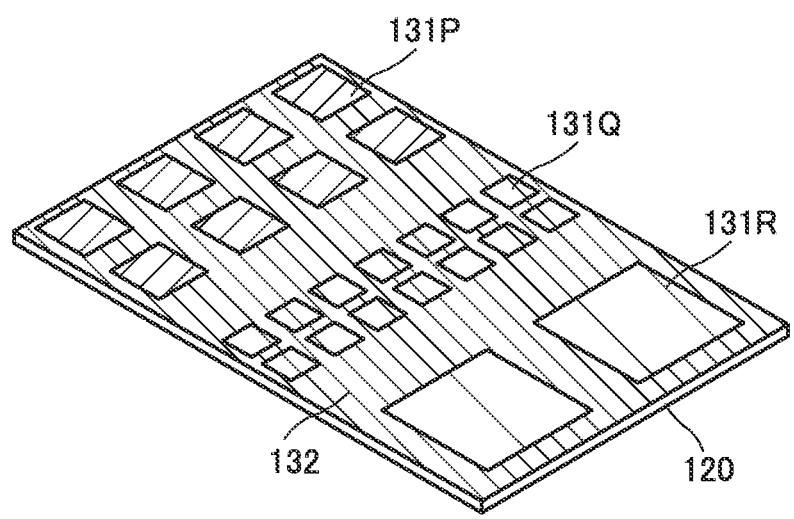

FIG. 4A shows a schematic diagram of a case where the sizes of the conductive layers functioning as antennas are varied, in a similar manner to the block diagram shown in FIG. 3B. FIG. 4B is a schematic diagram showing the conductive layer not functioning as an antenna, in addition to the conductive layers functioning as antennas shown in FIG. 4A.

In FIG. 4A, conductive layers 131P, 131Q, and 131R are shown as conductive layers with different sizes, which function as antennas, over the substrate 120. FIG. 4B shows the conductive layer 132 in addition to the structure shown in FIG. 4A.

Arranging the conductive layers functioning as antennas in a regular pattern with the conductive layer not functioning as an antenna provided therebetween as shown in FIG. 4B enables the use of beamforming technology with antennas arranged in an array. In addition, arranging the conductive layers functioning as antennas in a regular pattern with the conductive layer not functioning as an antenna provided therebetween as shown in FIG. 4B can prevent the formation of an area where the thickness of the conductive layer is small. Thus, the coverage with a thin film formed after the formation of the conductive layers can be improved and the surface can be flat.

With reference to FIG. 5A to FIG. 5F, structure examples of a conductive layer 131 that can be used as the conductive layers 131A to 131D functioning as antennas and shown in FIG. 3A will be described.

Figure 5A:
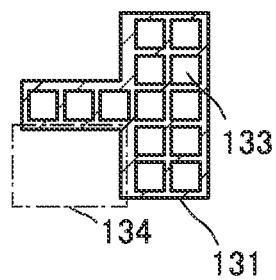
FIG. 5A to FIG. 5F are diagrams each illustrating a structure example of a display device.

FIG. 3A shows the conductive layers functioning as antennas, each having a rectangular shape with rectangular openings in a planar view; however, one embodiment of the present invention is not limited to this structure. For example, the conductive layer 131 may have an opening 133 and a cutout portion 134, as shown in FIG. 5A.

Figure 5B:
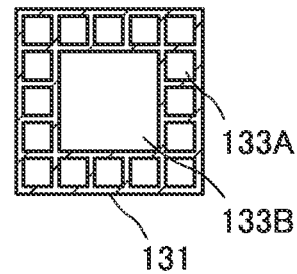

As another structure, the conductive layer 131 may have the openings 133A and 133B with different sizes, as shown in FIG. 5B, for example.

Figure 5C:
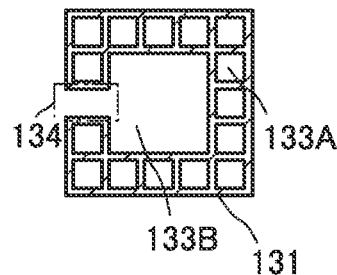

As another structure, the conductive layer 131 may have the cutout portion 134 in addition to the openings 133A and 133B with different sizes, as shown in FIG. 5C, for example.

Figure 5D:
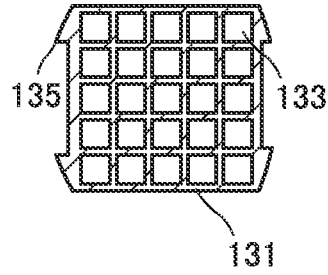

As another structure, the conductive layer 131 may have a protrusion 135 in addition to the opening 133, as shown in FIG. 5D, for example.

Figure 5E:
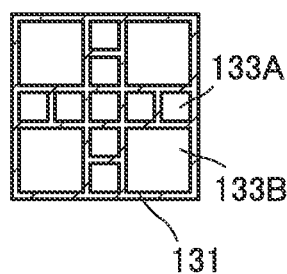

As another structure, the conductive layer 131 may have a plurality of openings 133A and a plurality of 133B differing in size, as shown in FIG. 5E, for example.

Figure 5F:
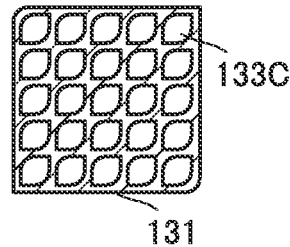

As another structure, the conductive layer 131 may have an opening 133C with round corners, as shown in FIG. 5F, for example. In addition, corners of the conductive layer 131 may be round as shown in FIG. 5F.

Figure 6A:
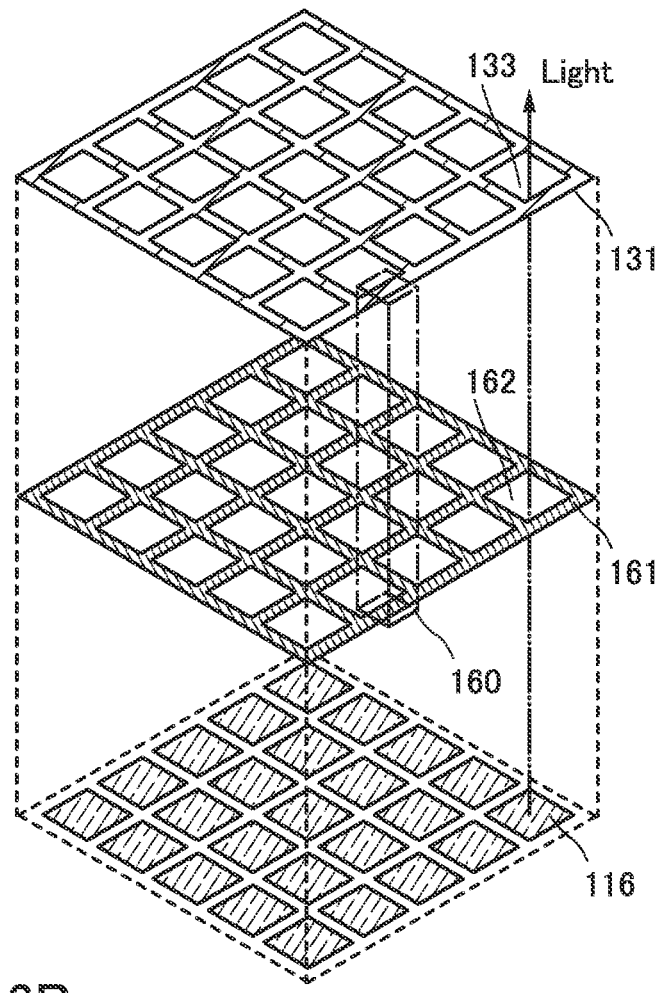
FIGS. 6A and 6B are diagrams illustrating a structure example of a display device.

With reference to FIG. 6A, an element layer that overlaps with the conductive layer 131 having the opening 133 and functioning as an antenna will be described. As shown in FIG. 6A, the conductive layer 131 is overlapped with an element layer 161 including a transistor. Furthermore, the opening 133 overlaps with an opening 162 included in the element layer 161 and the pixel 116. Light emitted by the pixel 116 (indicated by a dotted arrow in FIG. 6A) passes through the opening 162 and the opening 133.

Figure 6B:
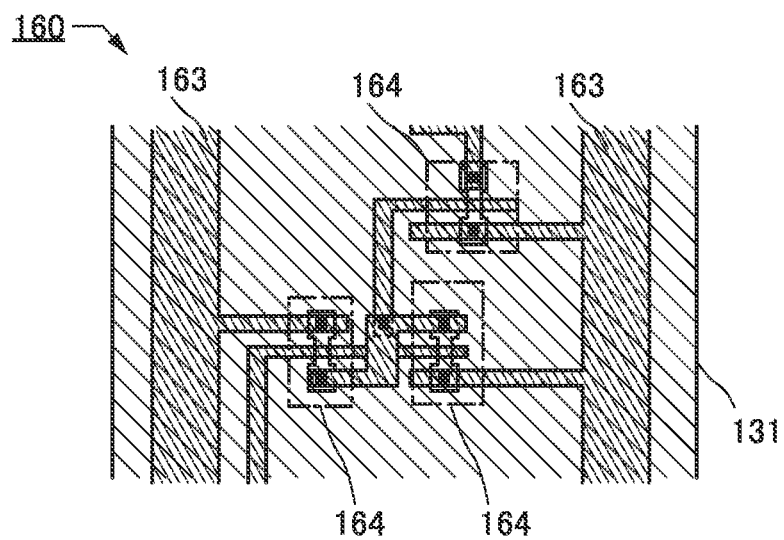

FIG. 6B is a diagram schematically illustrating how transistors and the conductive layer 131 overlap with each other in a plan view of a region 160 where the conductive layer 131 and the element layer 161 shown in FIG. 6A overlap with each other. FIG. 6B shows a plurality of transistors 164 connected to a wiring 163 included in the element layer 161. With the structure in which the element layer 161 including the transistors 164 is provided in a region overlapping with the conductive layer 131, as shown in FIG. 6B, part of the circuit included in the integrated circuit 141 illustrated in FIG. 2A and FIG. 2B can be provided on the element layer 161.

Specifically, as the components of the integrated circuit 141 that can be provided on the element layer 161, a duplexer, an amplifier, a mixer, or the like can be formed using the transistor 164 included in the element layer 161. An amplified signal is input to or output from the substrate 140 including the integrated circuit 141 via the FPC 122, which enables stable operation, as compared with the structure in which only antennas are provided on the substrate 120 side.

As the transistor included in the element layer 161, a transistor including an oxide semiconductor (a metal oxide) in its channel formation region (hereinafter referred to as an OS transistor) is preferably used. An OS transistor can be freely provided, for example, over an element layer including a transistor including silicon in a channel formation region (hereinafter, a Si transistor), over an element layer including an OS transistor, or the like, so that integration can be easily performed. Furthermore, an OS transistor can be manufactured with manufacturing equipment similar to that for a Si transistor and thus can be manufactured at low cost.

As the metal oxide, a metal oxide such as an In-M-Zn oxide (the element M is one or more of aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. For example, a metal oxide containing indium, zinc, and gallium (an In—Ga—Zn-based oxide), a metal oxide containing indium, zinc, and tin (an In—Sn—Zn-based oxide), a metal oxide containing indium, zinc, gallium, and tin (an In—Ga—Zn—Sn-based oxide), or the like can be suitably used.

The metal oxide functioning as an oxide semiconductor may be formed by a sputtering method or an ALD (Atomic Layer Deposition) method.

Figure 7A:
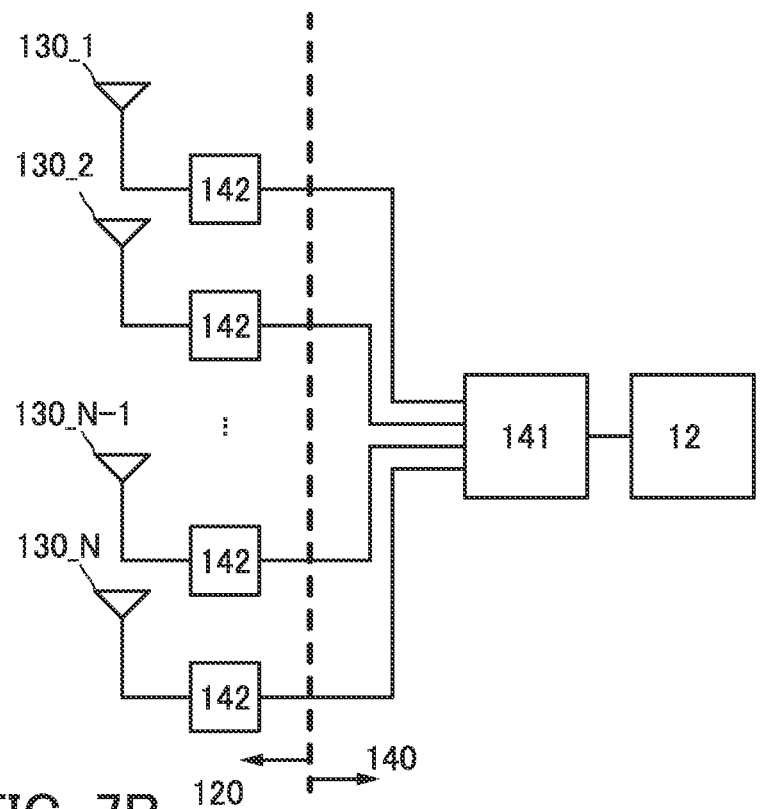
FIGS. 7A and 7B are diagrams each illustrating a structure example of a display device.

FIG. 7A corresponds to a structure in which amplifiers 142 are shown in addition to the structure of the block diagram shown in FIG. 2B. In addition to the antennas 130_1 to 130_N, the amplifiers 142 are provided on the substrate 120 side, using the transistors 164 and the like provided over the element layer 161, which can reduce the size of the circuit of the integrated circuit 141 provided on the substrate 140 side.

Figure 7B:
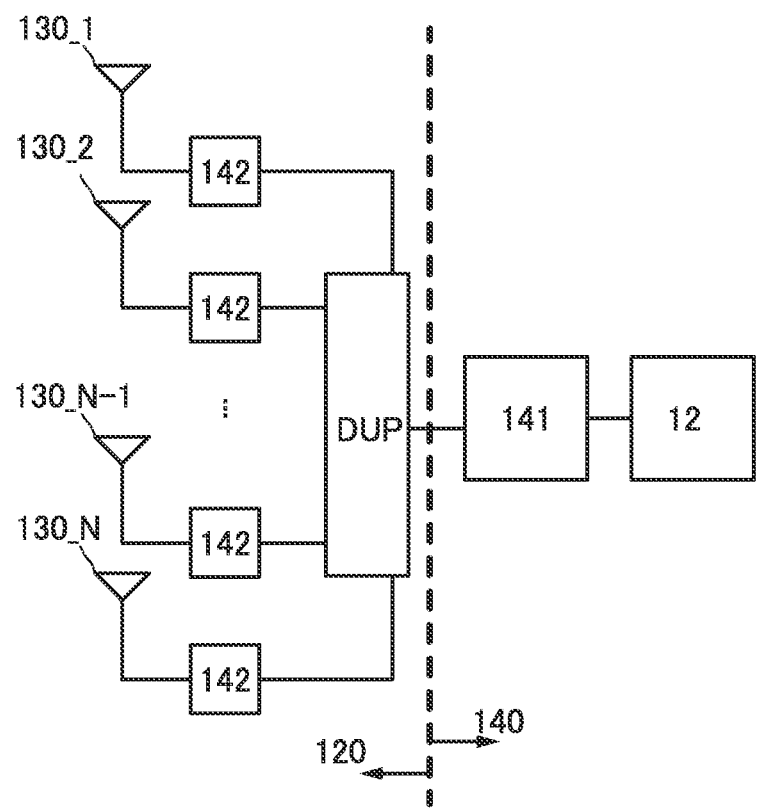

FIG. 7B corresponds to a structure in which a duplexer DUP is shown in addition to the structure of the block diagram shown in FIG. 7A. In addition to the antennas 130_1 to 130_N and the amplifier 142, the amplifiers 142 and the duplexer DUP are provided on the substrate 120 side, using the transistors 164 and the like provided over the element layer 161, which can reduce the size of the circuit of the integrated circuit 141 provided on the substrate 140 side.

FIGS. 8A to 8G, FIG. 9, and FIGS. 10A to 10E are schematic views each showing the positional relationship between a pixel, sub-pixels included in the pixel, and the conductive layer 131 which are seen from the display surface side.

Figure 8A:
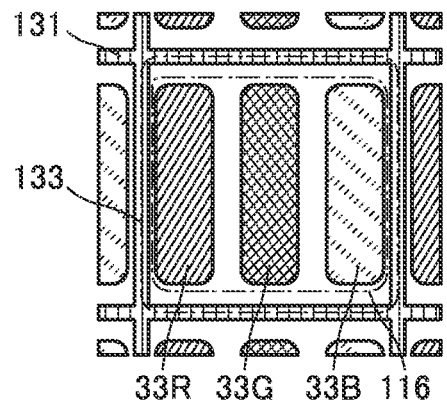
FIG. 8A to FIG. 8G are diagrams each illustrating a structure example of a display device.

FIG. 8A shows an example in which the pixel 116 includes three subpixels: a sub-pixel 33R, a sub-pixel 33G, and a sub-pixel 33B. For example, the sub-pixel 33R, the sub-pixel 33G, and the sub-pixel 33B have a function of expressing red color, green color, and blue color, respectively. Note that the number of sub-pixels and the colors of the sub-pixels included in the pixel 116 are not limited thereto.

The sub-pixels included in the pixel 116 each have a display element. Typical examples of the display element include light-emitting elements such as organic EL elements; liquid crystal elements; display elements (electronic ink) that perform display by an electrophoretic method, an electronic liquid powder (registered trademark) method, or the like; MEMS shutter display elements; and optical interference type MEMS display elements. The sub-pixel may include a transistor, a capacitor, a wiring that electrically connects the transistor and the capacitor, and the like in addition to the display element. Furthermore, one of the sub-pixels may be provided with a light-receiving element (e.g., a light-receiving element with an organic photodiode) so that the light-receiving element receives light emitted from the other sub-pixels, whereby the display device can have additional functions such as an image-capturing function or a sensing function.

The positional relation between the subpixels and the conductive layer 131 can be used in a transmissive liquid crystal display, a transflective liquid crystal display, a reflective liquid crystal display, a direct-view liquid crystal display, or the like. Note that for achieving a transflective liquid crystal display or a reflective liquid crystal display, some or all of pixel electrodes function as reflective electrodes. For example, some or all of pixel electrodes contain aluminum, silver, or the like. Moreover, in such a case, a memory circuit such as an SRAM can be provided under the reflective electrodes. Thus, the power consumption can be further reduced. A structure suitable for employed display elements, which is selected from a variety of pixel circuits, can be used.

In the structure shown in FIG. 8A, one opening 133 in the conductive layer 131 is provided to overlap with three sub-pixels, i.e., the sub-pixel 33R, the sub-pixel 33G, and the sub-pixel 33B. In this manner, the opening 133 in the conductive layer 131 is preferably provided to overlap with one pixel 116. In other words, the pixels 116 and the openings in the lattice of the conductive layer 131 are preferably provided at the same intervals. Such a structure allows the peripheral portions of the pixels 116 to have the same configurations (e.g., the structures of films in the pixels and in the periphery of the pixels, the thicknesses of the films, and the unevenness of surfaces thereof), leading to a reduction in display unevenness.

Figure 9:
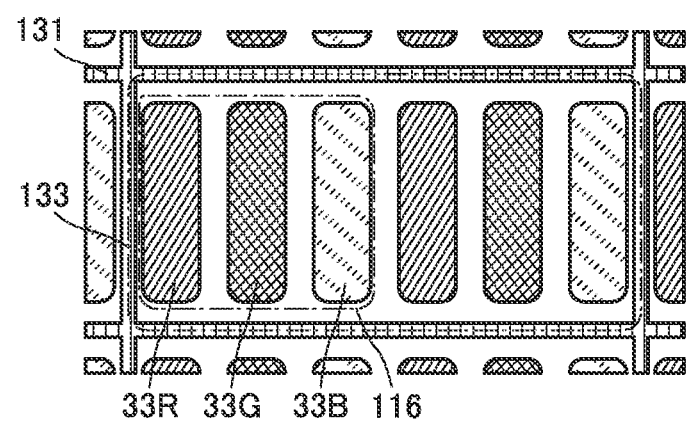
FIG. 9 is a diagram illustrating a structure example of a display device.

Note that two or more pixels 116 and one opening 133 may overlap with each other as shown in FIG. 9, for example.

Figure 8B:
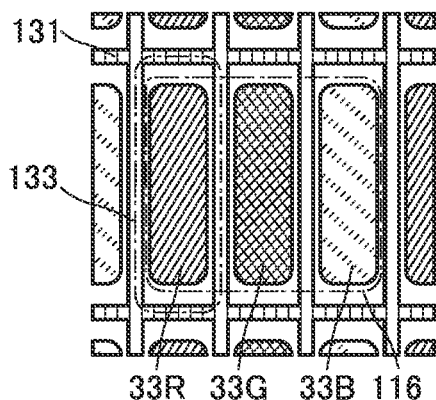

FIG. 8B shows an example where one opening 133 and one sub-pixel overlap with each other. When the conductive layer 131 is provided between two sub-pixels in one pixel 116 in a plan view, the wiring resistance of the conductive layer 131 can be reduced. As a result, the receiving sensitivity of an antenna can be improved.

Figure 8C:
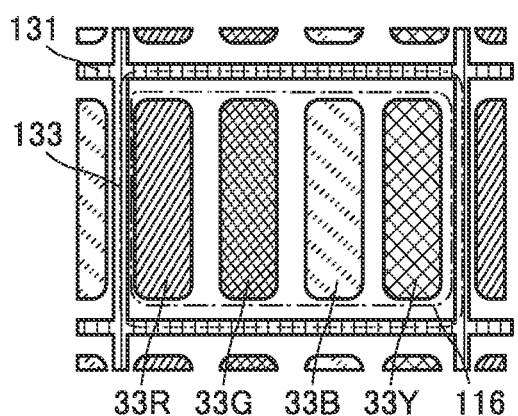

FIG. 8C shows an example where the pixel 116 further includes a sub-pixel 33Y, as compared with the structure shown in FIG. 8A. For example, a pixel capable of expressing yellow color can be used for the sub-pixel 33Y. Instead of the sub-pixel 33Y, a pixel capable of expressing white color may be used. When the pixel 116 includes sub-pixels of more than three colors, power consumption can be reduced.

Figure 8D:
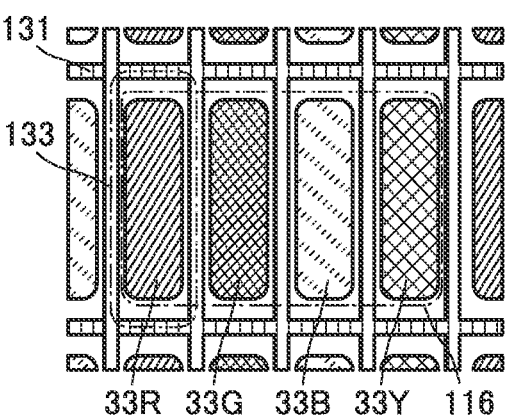

FIG. 8D shows an example where one opening 133 and one sub-pixel overlap with each other. That is, FIG. 8D shows an example where the conductive layer 131 is provided between two adjacent sub-pixels in a plan view. Note that a structure in which two of the four sub-pixels overlap with one opening 133 may be employed, although not shown.

Figure 8E:
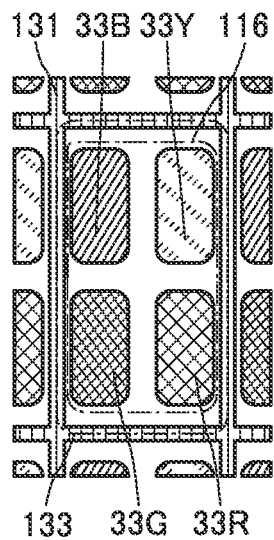
Figure 8F:
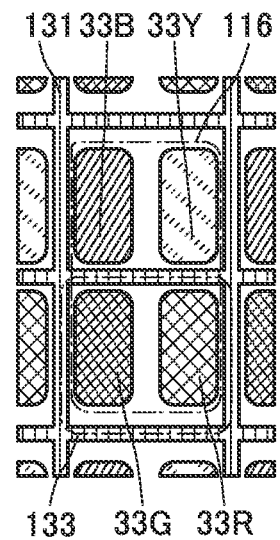
Figure 8G:
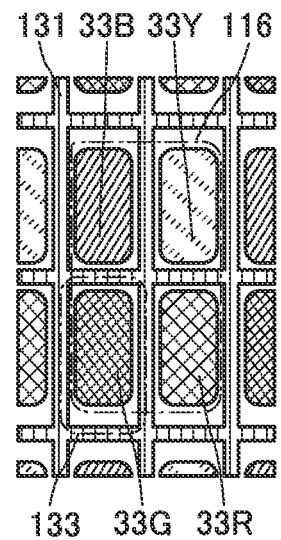

In the examples shown in FIGS. 8A to 8D, sub-pixels are arranged in a stripe pattern; however, sub-pixels of two colors may be alternated in one direction as shown in FIGS. 8E to 8G, for example. In a structure shown in FIG. 8E, the pixel 116 including four sub-pixels and one opening 133 overlap with each other. In a structure shown in FIG. 8F, two adjacent sub-pixels and one opening 133 overlap with each other. In a structure shown in FIG. 8G, one sub-pixel and one opening 133 overlap with each other.

Furthermore, the sub-pixels included in the pixel 116 may differ in size (e.g., the area of a region contributing to display). For example, the size of the sub-pixel of blue color with a relatively low luminosity factor can be set large, whereas the size of the sub-pixel of green or red color with a relatively high luminosity factor can be set small.

Figure 10A:
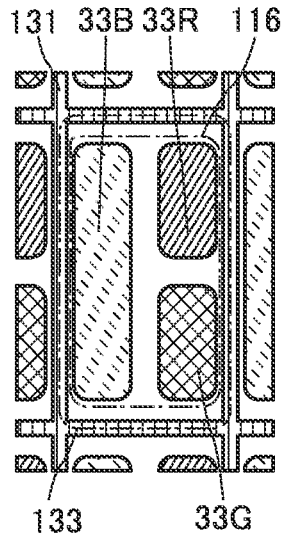
FIG. 10A to FIG. 10E are diagrams each illustrating a structure example of a display device.
Figure 10B:
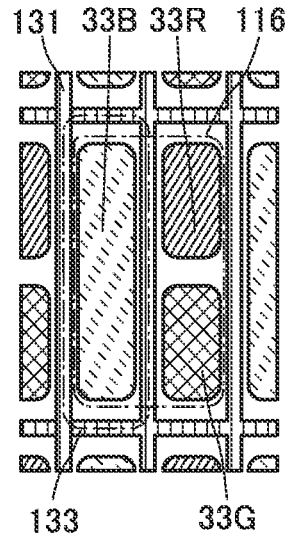

FIGS. 10A and 10B each show an example where the size of the sub-pixel 33B is larger than the size of the sub-pixel 33R and the size of the sub-pixel 33G. In the examples shown here, the sub-pixel 33R and the sub-pixel 33G are alternated; however, the three sub-pixels may be arranged in a stripe pattern as shown in FIG. 8A and other drawings, and may have different sizes from each other.

FIG. 10A shows a structure in which the pixel 116 including three sub-pixels and one opening 133 overlap with each other. FIG. 10B shows a structure in which one opening 113 and one sub-pixel 33B overlap with each other and another opening 133 and two sub-pixels (the sub-pixel 33R and the sub-pixel 33G) overlap with each other.

Figure 10C:
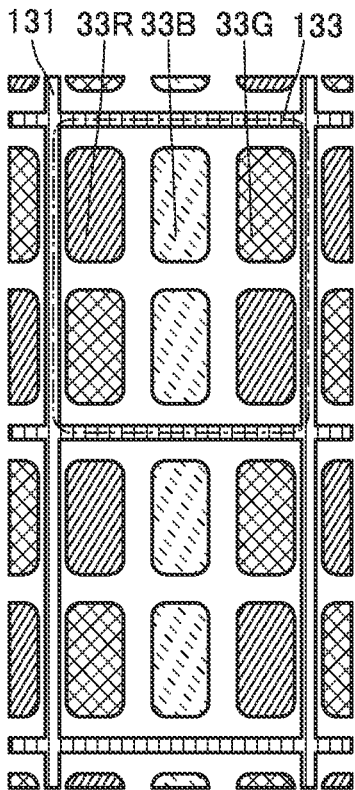
Figure 10D:
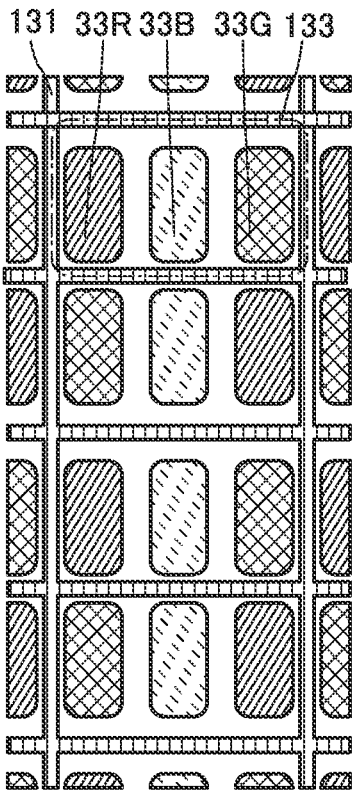
Figure 10E:
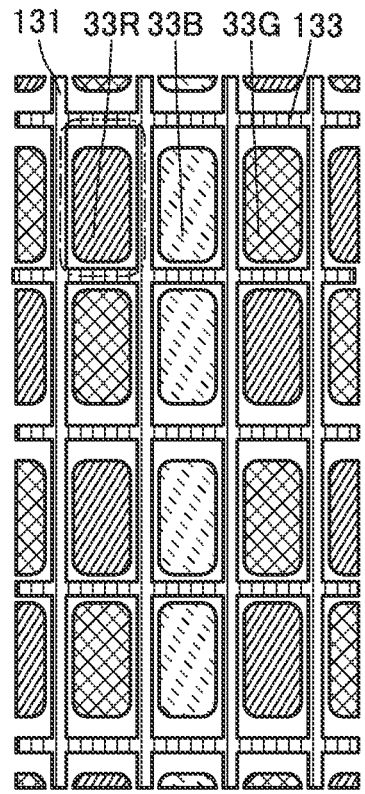

Alternatively, pixel structures as those shown in FIG. 10C to FIG. 10E can be employed. Here, a column of the sub-pixels 33B arranged in a stripe pattern is provided between columns in each of which sub-pixels 33R and 33G are alternated. Furthermore, one sub-pixel 33B is provided between one sub-pixel 33R and one sub-pixel 33G. Although the sub-pixels have stripe patterns in the structures shown in FIG. 10A to FIG. 10E, one embodiment of the present invention is not limited to these examples. For example, in the display device of one embodiment of the present invention, application to pentile sub-pixels is also possible.

In the structure shown in FIG. 10C, six sub-pixels (two sub-pixels for each color) overlap with one opening 133. In the structure shown in FIG. 10D, three sub-pixels (one sub-pixel for each color) overlap with one opening 133. In the structure shown in FIG. 10E, one sub-pixel and one opening 133 overlap with each other. Note that the pixel structure is not limited to the structures described here, and a structure in which two or more adjacent sub-pixels and one opening 133 overlap with each other may be employed.

The structure, configuration, method, and the like described in this embodiment can be used in combination as appropriate with the structures, configurations, methods, and the like described in the other embodiments, examples, and the like.

Embodiment 2

In this embodiment, structure examples of electronic devices including the display device 100 described in the above embodiment will be described with reference to FIGS. 11 and 12. Although a smartphone is described as an example of electronic devices in this embodiment, the electronic devices may be other electronic devices such as a portable game terminal, a tablet PC (Personal Computer), and a laptop PC. In addition, the electronic device of this embodiment can be used as other electronic devices that can perform wireless communication.

Figure 11A:
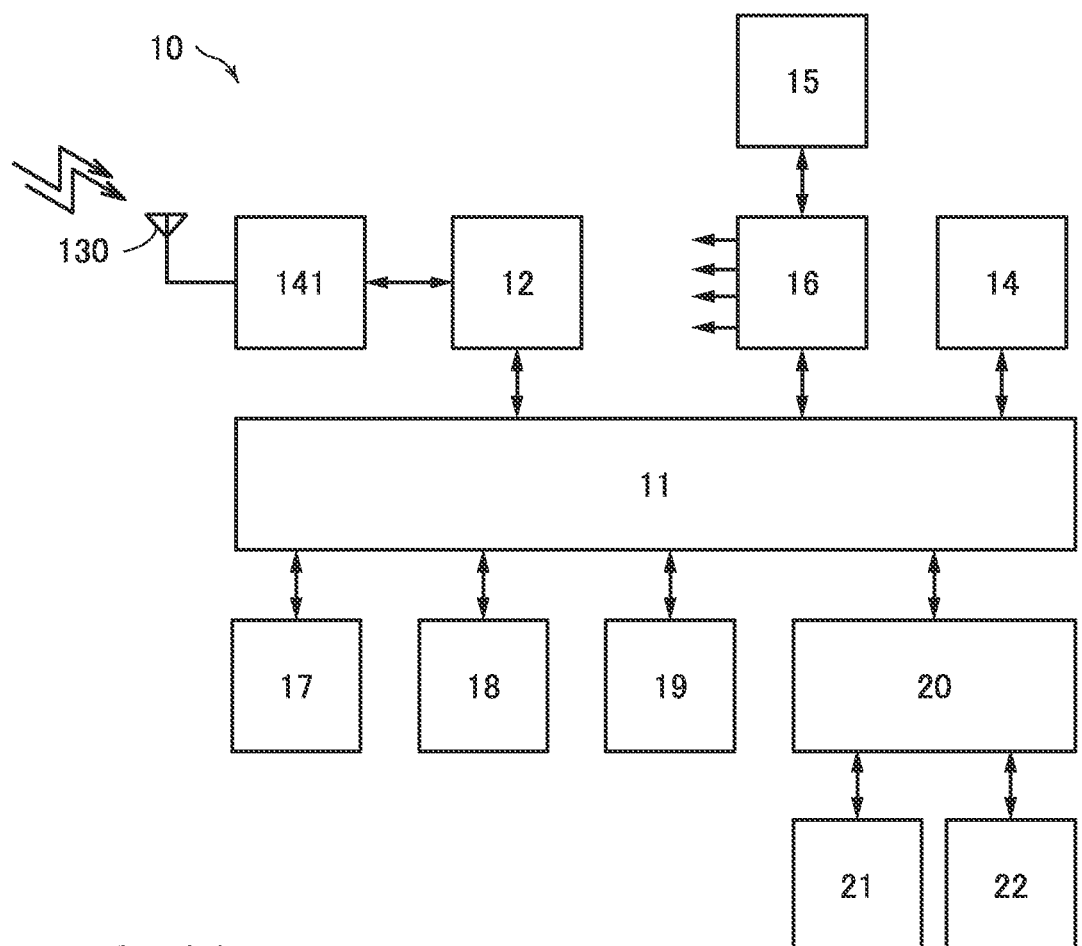
FIGS. 11A and 11B are diagrams illustrating a structure example of an electronic device.

An electronic device 10 shown in a block diagram in FIG. 11A includes the antennas 130, an application processor 11, the baseband processor 12, the integrated circuit 141 (IC), a memory 14, a battery 15, a power management IC (PMIC) 16, a display unit 17, a camera unit 18, an operation input unit 19, an audio IC 20, a microphone 21, and a speaker 22. Note that the integrated circuit 141 is also referred to as an RF (Radio Frequency) IC or a wireless chip, for example.

The antennas 130 are provided in accordance with frequency bands compatible with a communication standard of 5G. As described above in Embodiment 1, a plurality of antennas for a plurality of frequency bands can be placed, since it is possible to place the antennas to overlap with the display unit of the display device.

The application processor 11 has a function of performing processing for fulfilling various functions of the electronic device 10 by reading out a program stored in the memory 14. For example, the application processor 11 has a function of executing an OS (Operating System) program from the memory 14 and executing an application program with this OS program as an operating platform.

The baseband processor 12 has a function of performing baseband processing including encoding (e.g., error correction encoding) processing, decoding processing, or the like on data that is transmitted and received by the electronic device 10. Specifically, the baseband processor 12 has a function of receiving transmission data from the application processor 11, performing encoding processing on the received transmission data, and transmitting the data to the integrated circuit 141. In addition, the baseband processor 12 has a function of receiving reception data from the integrated circuit 141, performing decoding processing on the received reception data, and transmitting the data to the application processor 11.

The integrated circuit 141 has a function of performing modulation processing or demodulation processing on data that is transmitted and received by the electronic device 10. Specifically, the integrated circuit 141 has a function of generating a transmission signal by performing modulation processing using a carrier wave on the transmission data received from the baseband processor 12 and outputting the transmission signal via the antenna 130. In addition, the integrated circuit 141 has a function of receiving a reception signal via the antenna 130, generating reception data by performing demodulation processing using a carrier wave on the reception signal, and transmitting the reception data to the baseband processor 12.

The memory 14 has a function of storing a program and data used by the application processor 11. Note that the memory 14 includes a nonvolatile memory that holds stored data even when power supply is interrupted and a volatile memory in which stored data is cleared in the case where power supply is interrupted.

The battery 15 is used when the electronic device 10 operates without an external power supply. Note that the electronic device 10 can use power supply from the battery 15 also in the case where an external power supply is connected. A secondary battery capable of charging and discharging is preferably used as the battery 15.

The power management IC 16 has a function of generating internal power supply from the battery 15 or the external power supply. The internal power supply is applied to each of the blocks in the electronic device 10. At this time, the power management IC 16 has a function of controlling voltage of the internal power supply for each block to which the internal power supply is supplied. The power management IC 16 controls voltage of the internal power supply on the basis of an instruction from the application processor 11. In addition, the power management IC 16 can control supply and interrupt of the internal power supply on a block-by-block basis. The power management IC 16 also has a function of controlling charging to the battery 15 in the case where supply from the external power supply is obtained.

The display unit 17 is a liquid crystal display device or a light-emitting display device and has a function of displaying various images in response to processing in the application processor 11. Images to be displayed on the display unit 17 include a user interface image with which a user gives an operation instruction to the electronic device 10, a camera image, a moving image, and the like.

The camera unit 18 has a function of acquiring an image in accordance with the instruction from the application processor 11. The operation input unit 19 has a function of a user interface for a user to operate and give an operation instruction to the electronic device 10. The audio IC 20 has a function of driving the speaker 22 by decoding audio data transmitted from the application processor 11. In addition, the audio IC 20 has a function of generating audio data by encoding audio information obtained by the microphone 21 and outputting the audio data to the application processor 11.

Figure 11B:
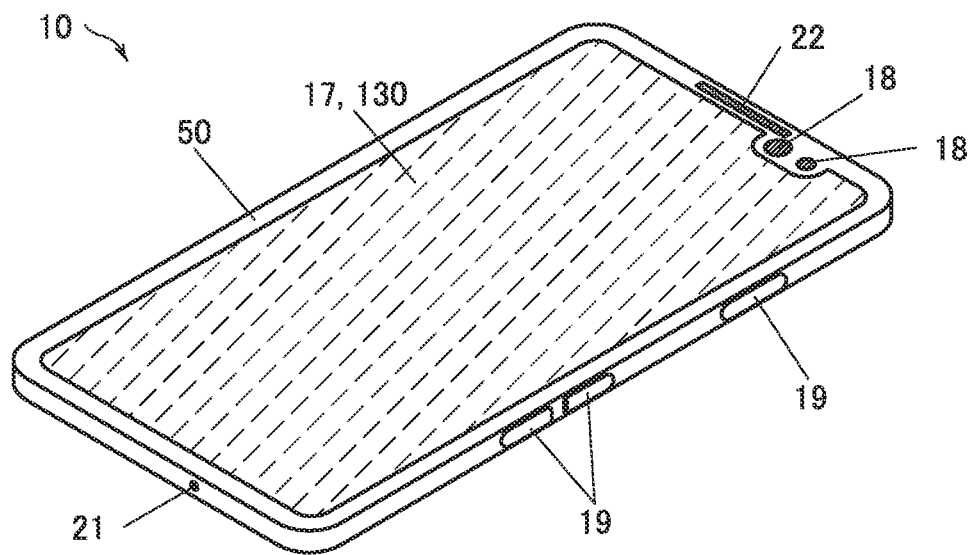

FIG. 11B is a perspective view of the electronic device 10 having the structures shown in FIG. 11A. FIG. 11B also shows some of the structures illustrated in FIG. 11A.

In FIG. 11B, the display unit 17 stored in a housing 50 functions as the antenna 130. FIG. 11B also shows the camera unit 18, the operation input unit 19, the microphone 21, and the speaker 22 shown in FIG. 11A.

As shown in FIG. 11B, the display unit 17 occupies a large portion of the housing 50. Thus, the structure where the conductive layers functioning as antennas are placed over the substrate serving as the display unit and the structure of one embodiment of the present invention where the element layer including transistors or the like is placed to overlap with the conductive layers enable extension of communication distances and a reduction in size of integrated circuits.

Figure 12:
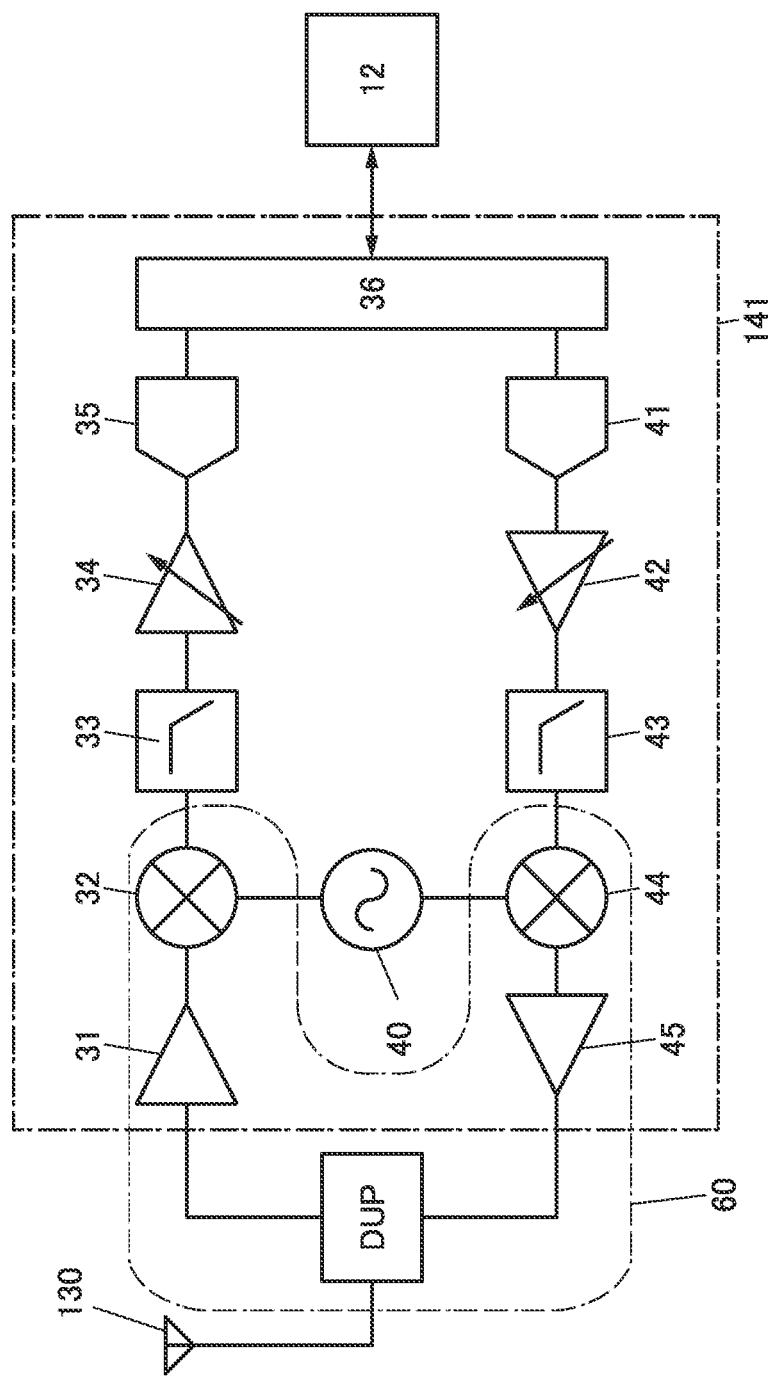
FIG. 12 is a diagram illustrating a structure example of an integrated circuit.

FIG. 12 is a block diagram for illustrating a structure example of the integrated circuit 141. The integrated circuit 141 shown in FIG. 12 includes a low noise amplifier 31, a mixer 32, a low-pass filter 33, a variable gain amplifier 34, an analog-digital converter circuit 35, an interface unit 36, a digital-analog converter circuit 41, a variable gain amplifier 42, a low-pass filter 43, a mixer 44, a power amplifier 45, and an oscillation circuit 40. FIG. 12 also shows the antenna 130, a duplexer DUP, and the baseband processor 12. Note that the low noise amplifier 31, the mixer 32, the low-pass filter 33, the variable gain amplifier 34, and the analog-digital converter circuit 35 are referred to as a receiving circuit block, and the digital-analog converter circuit 41, the variable gain amplifier 42, the low-pass filter 43, the mixer 44, and the power amplifier 45 are referred to as a transmitting circuit block in some cases.

Note that the baseband processor 12 and the integrated circuit 141 are formed of separate semiconductor chips.

Note that any one of the components enclosed by a dashed-dotted line 60 in FIG. 12, i.e., the duplexer DUP, the low noise amplifier 31 which is an amplifier, the mixer 32, the mixer 44, and the power amplifier 45 which is an amplifier, can be formed using the transistor described above in Embodiment 1. The transistor is provided to overlap with the conductive layers provided over the substrate, and thus can be provided in the display unit. For this reason, some of the circuits included in the integrated circuit 141 which is a semiconductor chip can be provided on the display unit side, which enables the integrated circuit to be downsized.

The low noise amplifier 31 amplifies a signal received by the antenna 130 with low noise. The mixer 32 performs demodulation and downconversion (frequency conversion) using a signal of the oscillation circuit 40. The low-pass filter 33 removes an unnecessary high-frequency component from a signal from the mixer 32. The variable gain amplifier 34 amplifies an output signal from the low-pass filter 33 with a gain taking the input range of the analog-digital converter circuit 35 into account. The analog-digital converter circuit 35 converts the analog signal from the variable gain amplifier 34 into a digital signal. The digital signal is output to the baseband processor 12 via the interface unit 36 and a differential interface circuit.

The digital-analog converter circuit 41 converts the digital signal received by the interface unit 36 into an analog signal. The variable gain amplifier 42 amplifies an output signal from the digital-analog converter circuit 41. The low-pass filter 43 removes an unnecessary high-frequency component from a signal from the variable gain amplifier 42. The mixer 44 performs modulation and upconversion (frequency conversion) of the analog signal using a signal of the oscillation circuit 40. The power amplifier 45 amplifies an output signal from the mixer 44 with a predetermined gain and outputs the signal.

The structure, composition, method, and the like described in this embodiment can be used in combination as appropriate with the structures, compositions, methods, and the like described in the other embodiments, the example, and the like.

Embodiment 3

In this embodiment, a schematic cross-sectional view of the display device 100 described above in Embodiment 1 and a modification example of the schematic cross-sectional view will be described.

Figure 13:
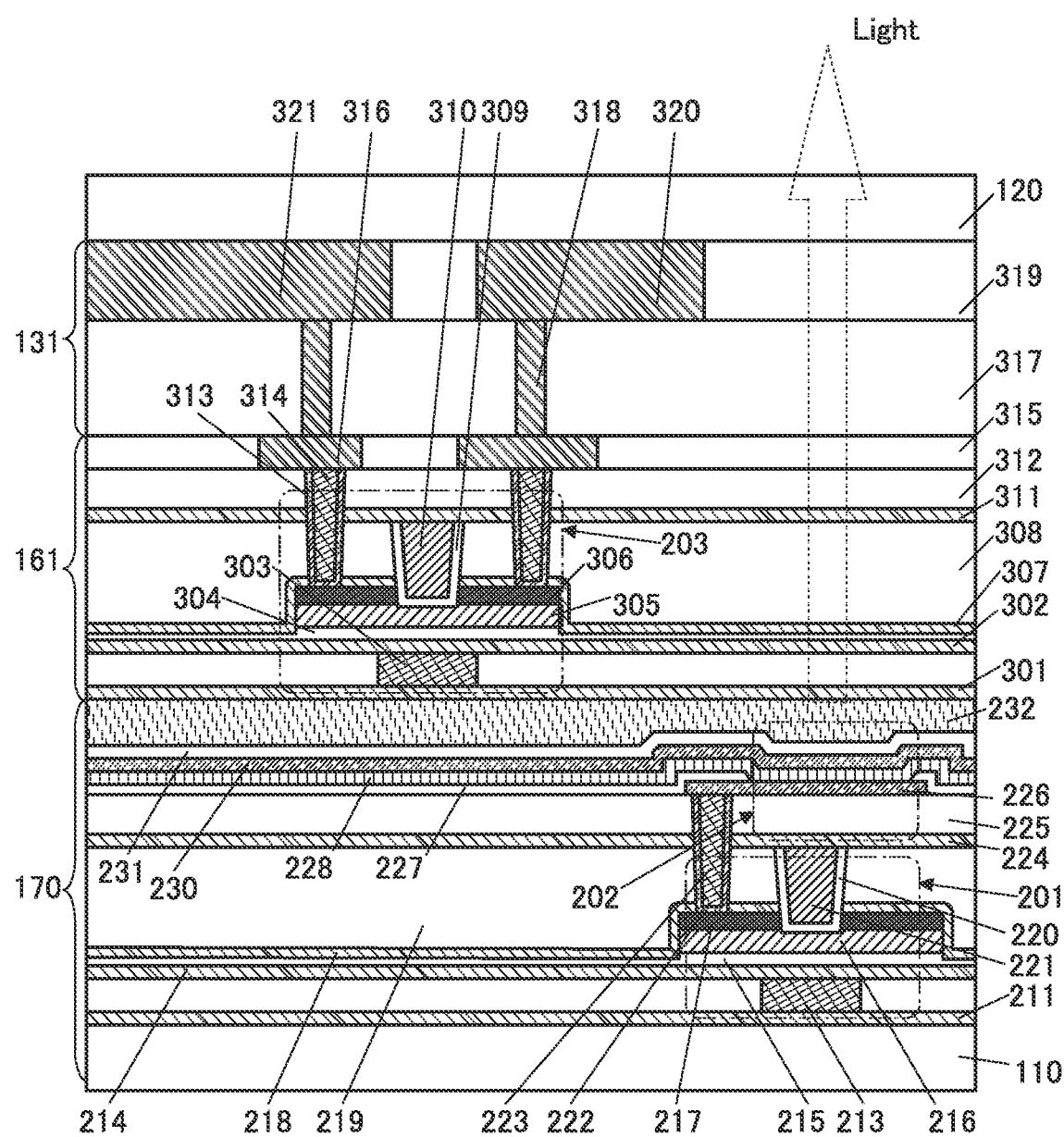
FIG. 13 is a diagram illustrating a structure example of a display device.

FIG. 13 is a schematic cross-sectional view of a display device that can be used as the display device described in Embodiment 1. FIG. 13 shows a cross-sectional configuration on the substrate 110 side as the display unit 170, and the conductive layer 131 and the element layer 161 on the substrate 120 side. The display unit 170 includes a transistor 201 and a light-emitting element 202 as an example of the display element. The element layer 161 includes a transistor 203.

FIG. 13 shows the cross-sectional configuration of a case in which a metal oxide (also referred to as oxide semiconductor) is used as a semiconductor where a channel is formed, as the transistor 201 and the transistor 203. A single crystal semiconductor substrate using silicon or silicon carbide, a polycrystalline semiconductor substrate, a compound semiconductor substrate of silicon germanium or the like, a semiconductor substrate such as an SOI substrate, or the like may be used as the semiconductor where a channel is formed.

A structure example of the substrate 110 side is described.

The transistor 201 includes a semiconductor layer 216, an insulating layer 220, a conductive layer 221, a conductive layer 217, a conductive layer 213, an insulating layer 215, an insulating layer 214, and the like.

An insulating substrate such as a glass substrate, a quartz substrate, a sapphire substrate, or a ceramic substrate; a single crystal semiconductor substrate or a polycrystalline semiconductor substrate including silicon, silicon carbide, or the like as a material; a compound semiconductor substrate of silicon germanium or the like; or a semiconductor substrate such as an SOI substrate can be used as the substrate 110 over which the transistor 201 is provided. It is also possible to use a flexible substrate as the substrate 110, like the substrate 120 described later, whereby the display device can be used as a flexible display device.

An insulating layer 211 is provided over the substrate 110. The insulating layer 211 functions as a barrier layer that prevents diffusion of impurities such as water and hydrogen from the substrate 110 into the transistor 201 and diffusion of oxygen from the semiconductor layer 216 to the insulating layer 211 side. As the insulating layer 211, a film in which hydrogen or oxygen is less likely to be diffused than in a silicon oxide film, such as an aluminum oxide film, a hafnium oxide film, or a silicon nitride film, can be used, for example.

The conductive layer 213 is provided over the insulating layer 211, and the insulating layer 215 and the insulating layer 214 are provided to cover the conductive layer 213. The semiconductor layer 216 is provided over the insulating layer 215. The conductive layer 213 functions as a first gate electrode of the transistor 201, and part of the insulating layer 215 and part of the insulating layer 214 each function as a first gate insulating layer. As the insulating layer 215 in contact with the semiconductor layer 216, an oxide insulating film such as a silicon oxide film is preferably used. The insulating layer 214 between the insulating layer 215 and the conductive layer 213 is preferably formed using an insulating film functioning as a barrier layer, like the insulating layer 211.

The semiconductor layer 216 preferably includes a film of a metal oxide exhibiting semiconductor characteristics (an oxide semiconductor).

The pair of conductive layers 217 is provided to be apart from each other over the semiconductor layer 216. The conductive layers 217 function as a source electrode and a drain electrode. An insulating layer 218 is provided to cover the semiconductor layer 216 and the conductive layer 217, and an insulating layer 219 is provided over the insulating layer 218. An opening reaching the semiconductor layer 216 is provided in the insulating layer 218 and the insulating layer 219, and the insulating layer 220 and the conductive layer 221 are embedded in the opening. An insulating layer 224 is provided to cover top surfaces of the insulating layer 219, the conductive layer 221, and the insulating layer 220.

The conductive layer 221 functions as a second gate electrode. The insulating layer 220 functions as a second gate insulating layer.

The insulating layer 218 and the insulating layer 224 are preferably formed using an insulating film functioning as a barrier layer, like the insulating layer 211 or the like. Covering the conductive layer 217 with the insulating layer 218 can prevent oxidation of the conductive layer 217 due to oxygen contained in the insulating layer 219.

A plug electrically connected to the conductive layer 217 is provided in the opening provided in the insulating layer 225, the insulating layer 224, the insulating layer 219, and the insulating layer 218. The plug preferably includes a conductive layer 222 in contact with a side surface of the opening and a top surface of the conductive layer 217 and a conductive layer 223 embedded inside the conductive layer 222. In this case, a conductive material in which hydrogen and oxygen are unlikely to be diffused is preferably used for the conductive layer 222.

The light-emitting element 202 has a structure in which a conductive layer 226, an EL layer 228, and a conductive layer 230 are stacked in this order. The light-emitting element 202 is what is called a top-emission light-emitting element that emits light to the side opposite to the formation surface side. The conductive layer 230 preferably has a light-transmitting property. The conductive layer 226 preferably has a function of reflecting light. Light emitted from the EL layer 228 to the substrate 110 side is reflected by the conductive layer 226 and emitted to the substrate 120 side.

Note that as a light-emitting element that can be used as the light-emitting element 202, a self-luminous element can be used, and an element whose luminance is controlled by current or voltage is included in the category. For example, an LED, an organic EL element, an inorganic EL element, or the like can be used. In particular, an organic EL element is preferably used.

The EL layer 228 includes at least a light-emitting layer. In addition to the light-emitting layer, the EL layer 228 may further include layers containing a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), and the like.

Either a low molecular compound or a high molecular compound can be used for the EL layer 228, and an inorganic compound may also be contained. The layers included in the EL layer 228 can each be formed by a method such as an evaporation method (including a vacuum evaporation method), a transfer method, a printing method, an inkjet method, or a coating method.

When a voltage higher than the threshold voltage of the light-emitting element 202 is applied between a cathode and an anode, holes are injected to the EL layer 228 from the anode side and electrons are injected to the EL layer 228 from the cathode side. The injected electrons and holes are recombined in the EL layer 228 and a light-emitting substance contained in the EL layer 228 emits light.

In the case where a light-emitting element emitting white light is used as the light-emitting element 202, the EL layer 228 preferably contains two or more kinds of light-emitting substances. A white emission can be obtained by selecting light-emitting substances so that two or more light-emitting substances emit light of complementary colors, for example. For example, it is preferable to contain two or more out of light-emitting substances emitting light of R (red), G (green), B (blue), Y (yellow), O (orange), and the like or light-emitting substances emitting light containing two or more of spectral components of R, G, and B. A light-emitting element whose emission spectrum has two or more peaks in the wavelength range of a visible light region (e.g., 350 nm to 750 nm) is preferably employed. An emission spectrum of a material having a peak in a yellow wavelength range preferably has spectral components also in green and red wavelength ranges.

The EL layer 228 preferably has a structure in which a light-emitting layer containing a light-emitting material emitting light of one color and a light-emitting layer containing a light-emitting material emitting light of another color are stacked. For example, the plurality of light-emitting layers in the EL layer 228 may be stacked in contact with each other or may be stacked with a region not including any light-emitting material therebetween. For example, between a fluorescent layer and a phosphorescent layer, a region that contains the same material as the fluorescent layer or phosphorescent layer (for example, a host material or an assist material) and no light-emitting material may be provided. This facilitates the fabrication of the light-emitting element and reduces the drive voltage.

The light-emitting element 202 may be a single element including one EL layer or a tandem element in which a plurality of EL layers are stacked with a charge-generation layer therebetween.

Note that the aforementioned light-emitting layer and layers containing a substance with a high hole-injection property, a substance with a high hole-transport property, a substance with a high electron-transport property, a substance with a high electron-injection property, a substance with a bipolar property, and the like may include an inorganic compound such as a quantum dot or a high molecular compound (e.g., an oligomer, a dendrimer, and a polymer). For example, when used for the light-emitting layer, the quantum dots can function as a light-emitting material.

As the quantum dot material, a colloidal quantum dot material, an alloyed quantum dot material, a core-shell quantum dot material, a core quantum dot material, or the like can be used. The material containing elements belonging to Groups 12 and 16, elements belonging to Groups 13 and 15, or elements belonging to Groups 14 and 16, may be used. Alternatively, the quantum dot material containing an element such as cadmium, selenium, zinc, sulfur, phosphorus, indium, tellurium, lead, gallium, arsenic, or aluminum may be used.

The light-emitting units in each of which a conductive film having a transmitting property and reflectivity is used as the conductive layer 230 may have what is called a microcavity structure. In that case, the optical length between the surface of the reflective layer 226 reflecting visible light and the conductive layer 230 having a transmitting property and reflectivity with respect to visible light is preferably adjusted to $m\lambda/2$ (m is a natural number) or the vicinity thereof, where $\lambda$ is the wavelength of light whose intensity is desired to be increased. In order to adjust the optical lengths in the light-emitting units, the thickness of the conductive layer 226 or the like can be varied between the light-emitting units.

Note that light emitted from the light-emitting element 202, with light of a wavelength other than a predetermined wavelength being absorbed by a coloring layer, is emitted to the outside as red light, green light, or blue light, for example. The above-mentioned quantum dot material can be used for the coloring layer. In the case where the above structure is employed, color conversion (wavelength conversion) can be performed with the quantum dot material when light emitted from the light-emitting element 202 is blue. Such a structure is suitable because the light-emitting elements 202 do not need to be separately formed and thus the manufacturing cost can be reduced.

Note that a photodiode, which is a light-receiving element, may be provided in the same layer as the light-emitting element 202. With the structure, the display device can be provided with a touch sensor function. An active layer of the light-receiving element can have a stacked-layer structure in which a p-type semiconductor and an n-type semiconductor are stacked to form a pn junction; or a stacked-layer structure in which a p-type semiconductor, an i-type semiconductor, and an n-type semiconductor are stacked to form a pin junction, for example.

As the semiconductor used for the active layer of the light-receiving element, an inorganic semiconductor such as silicon or an organic semiconductor containing an organic compound can be used. In particular, the use of an organic semiconductor material is preferable, in which case the EL layer 228 of the light-emitting element 202 and the active layer of the light-receiving element are easily formed by a vacuum evaporation method, and thus the same manufacturing apparatus can be used.

When an organic semiconductor material is used for the active layer of the light-receiving element, an electron-accepting organic semiconductor material such as fullerene (e.g., $C_{60}$ or $C_{70}$) or its derivative can be used as an n-type semiconductor material. As a p-type semiconductor material, an electron-donating organic semiconductor material such as copper(II) phthalocyanine (CuPc) or tetraphenyldibenzoperiflanthene (DBP) can be used. The active layer of the light-receiving element may have a stacked-layer structure (a p-n stacked-layer structure) including an electron-accepting semiconductor material and an electron-donating semiconductor material, or a stacked-layer structure (a p-i-n stacked-layer structure) in which a bulk heterostructure layer formed by co-evaporation of an electron-accepting semiconductor material and an electron-donating semiconductor material is provided therebetween. Furthermore, a layer functioning as a hole-blocking layer or a layer functioning as an electron-blocking layer may be provided around (above or below) the p-n stacked-layer structure or the p-i-n stacked-layer structure, in order to inhibit dark current caused when light is not applied.

Over the light-emitting element 202, an insulating layer 231 and an insulating layer 232 are stacked to cover the light-emitting element 202. These two insulating layers each function as a protective layer that prevents diffusion of impurities such as water into the light-emitting element 202. As the insulating layer 231, it is preferable to use an inorganic insulating film with low moisture permeability, such as a silicon oxide film, a silicon nitride film, or an aluminum oxide film. As the insulating layer 232, an organic insulating film having a high light-transmitting property can be used. Using an organic insulating film as the insulating layer 232 can reduce the influence of uneven shape below the insulating layer 232, so that the surface of the insulating layer 232 can be smooth. This can increase adhesion at the time when the element layer 161 is bonded thereto.

The structure example of the substrate 120 side is described.

The transistor 203 includes a semiconductor layer 305, an insulating layer 309, a conductive layer 310, a conductive layer 306, a conductive layer 303, an insulating layer 304, an insulating layer 302, and the like.

The descriptions of the semiconductor layer 305, the insulating layer 309, the conductive layer 310, the conductive layer 306, the conductive layer 303, the insulating layer 304, and the insulating layer 302 in the transistor 203 are the same as those of the semiconductor layer 216, the insulating layer 220, the conductive layer 221, the conductive layer 217, the conductive layer 213, the insulating layer 215, and the insulating layer 214 in the transistor 201.

Note that the description of an insulating layer 301, which is a component other than the transistor 203, is the same as that of the insulating layer 211. The descriptions of an insulating layer 307, an insulating layer 308, an insulating layer 311, and an insulating layer 312 are the same as those of the insulating layer 218, the insulating layer 219, the insulating layer 224, and the insulating layer 225, respectively. The description of the insulating layer 307 is the same as that of the insulating layer 218. The descriptions of a conductive layer 313 and a conductive layer 314 are the same as those of the conductive layer 222 and the conductive layer 223.

A conductive layer 316 provided in an insulating layer 315 and a conductive layer 318 provided in an insulating layer 317 function as wirings for electrically connecting the transistor 203 to a conductive layer 320 or a conductive layer 321.

The conductive layer 320 provided in an insulating layer 319 functions as an antenna. The conductive layer 321 provided in the insulating layer 319 functions as a wiring. The conductive layer 320 and the conductive layer 321 are preferably placed in positions not overlapping with the light-emitting element 202 so that light from the light-emitting element 202 is emitted to the display surface side.

Note that the transistor 203 can be formed over the insulating layer 301 which is formed over a separately prepared substrate with a separation layer, in a manner similar to the transistor 201. The substrate 120 provided with the element layer 161 and the conductive layer 131 can be bonded to the substrate 110 side after the substrate is peeled off at a separation surface in the separation layer. Note that the substrate 110 and the substrate 120 may be bonded to each other using an adhesive layer provided on the substrate perimeter. As the substrate 120, a substrate having a light-transmitting property such as a glass substrate, a quartz substrate, a sapphire substrate, or a plastic substrate can be used. With the substrate 120 and the substrate 110 being flexible substrates, the display device can be used as a flexible display device.

Next, components such as a transistor that can be employed in the above-described display device will be described below.

The transistors each include a conductive layer functioning as a gate electrode, a semiconductor layer, a conductive layer functioning as a source electrode, a conductive layer functioning as a drain electrode, and an insulating layer functioning as a gate insulating layer.

Note that there is no particular limitation on the structure of the transistor included in the display device of one embodiment of the present invention. For example, a planar transistor, a staggered transistor, or an inverted staggered transistor may be used. A top-gate or bottom-gate transistor structure may be employed. Gate electrodes may be provided above and below a channel.

There is no particular limitation on the crystallinity of a semiconductor material used for the transistors, and any of an amorphous semiconductor, a single crystal semiconductor, and a semiconductor having crystallinity other than the single crystal semiconductor (a microcrystalline semiconductor, a polycrystalline semiconductor, or a semiconductor partly including crystal regions) may be used. It is preferable that a single crystal semiconductor or a semiconductor having crystallinity be used, in which case deterioration of the transistor characteristics can be suppressed.

In particular, a transistor that uses a metal oxide film for a semiconductor layer where a channel is formed will be described below.

As a semiconductor material used for the transistors, a metal oxide whose energy gap is greater than or equal to 2 eV, preferably greater than or equal to 2.5 eV, further preferably greater than or equal to 3 eV can be used. A typical example thereof is a metal oxide containing indium, and for example, a CAC-OS described later or the like can be used.

A transistor using a metal oxide having a wider band gap and a lower carrier density than silicon has a low off-state current; thus, charges accumulated in a capacitor that is connected in series with the transistor can be held for a long time.

The semiconductor layer can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where the metal oxide contained in the semiconductor layer is an In-M-Zn-based oxide, it is preferable that the atomic ratio of metal elements of a sputtering target used for forming a film of the In-M-Zn oxide satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer varies from the above atomic ratio of metal elements of the sputtering target in a range of ±40%.

A metal oxide film with a low carrier density is used as the semiconductor layer. For example, for the semiconductor layer, a metal oxide whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such a metal oxide is referred to as a highly purified intrinsic or substantially highly purified intrinsic metal oxide. The metal oxide has a low impurity concentration and a low density of defect states and can thus be referred to as a metal oxide having stable characteristics.

Note that, without limitation to those described above, an oxide semiconductor with an appropriate composition may be used in accordance with required semiconductor characteristics and electrical characteristics (e.g., field-effect mobility and threshold voltage) of the transistor. To obtain the required semiconductor characteristics of the transistor, it is preferable that the carrier density, the impurity concentration, the density of defect states, the atomic ratio between a metal element and oxygen, the interatomic distance, the density, and the like of the semiconductor layer be set to appropriate values.

When silicon or carbon, which is one of Group 14 elements, is contained in the metal oxide contained in the semiconductor layer, oxygen vacancies are increased in the semiconductor layer, and the semiconductor layer becomes n-type. Thus, the concentration of silicon or carbon (concentration obtained by secondary ion mass spectrometry) in the semiconductor layer is set to lower than or equal to $2\times10^{18}$ atoms/$cm^3$, preferably lower than or equal to $2\times10^{17}$ atoms/$cm^3$.

Alkali metal and alkaline earth metal might generate carriers when bonded to a metal oxide, in which case the off-state current of the transistor might be increased. Thus, the concentration of alkali metal or alkaline earth metal of the semiconductor layer, which is obtained by secondary ion mass spectrometry, is set to lower than or equal to $1\times10^{18}$ atoms/$cm^3$, preferably lower than or equal to $2\times10^{16}$ atoms/$cm^3$.

When nitrogen is contained in the metal oxide contained in the semiconductor layer, electrons serving as carriers are generated and the carrier density increases, so that the semiconductor layer easily becomes n-type. As a result, a transistor including a metal oxide that contains nitrogen is likely to have normally-on characteristics. Hence, the nitrogen concentration obtained by secondary ion mass spectrometry is preferably set to lower than or equal to $5\times10^{18}$ atoms/cm$^3$.

Oxide semiconductors are classified into a single crystal oxide semiconductor and a non-single-crystal oxide semiconductor. Examples of the non-single-crystal oxide semiconductor include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

A CAC-OS (Cloud-Aligned Composite oxide semiconductor) may be used for a semiconductor layer of a transistor disclosed in one embodiment of the present invention.

The aforementioned non-single-crystal oxide semiconductor or CAC-OS can be suitably used for a semiconductor layer of a transistor disclosed in one embodiment of the present invention. As the non-single-crystal oxide semiconductor, the nc-OS or the CAAC-OS can be suitably used.

In one embodiment of the present invention, a CAC-OS is preferably used for a semiconductor layer of a transistor. The use of the CAC-OS allows the transistor to have high electrical characteristics or high reliability.

The semiconductor layer may be a mixed film including two or more of a region of a CAAC-OS, a region of a polycrystalline oxide semiconductor, a region of an nc-OS, a region of an a-like OS, and a region of an amorphous oxide semiconductor. The mixed film has, for example, a single-layer structure or a stacked-layer structure including two or more of the above regions in some cases.

Next, the composition of a CAC (Cloud-Aligned Composite)-OS that can be used in a transistor disclosed in one embodiment of the present invention will be described below.

A CAC-OS refers to one composition of a material in which elements constituting a metal oxide are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in a metal oxide is hereinafter referred to as a mosaic pattern or a patch-like pattern.

Note that the metal oxide preferably contains at least indium. In particular, indium and zinc are preferably contained. In addition, one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (of the CAC-OS, an In—Ga—Zn oxide may be particularly referred to as CAC-IGZO) has a composition (hereinafter, also referred to as cloud-like composition) in which materials are separated into indium oxide (hereinafter, InO$_{X1}$ (X1 is a real number greater than 0)) or indium zinc oxide (hereinafter, In$_{X2}$Zn$_{Y2}$O$_{Z2}$ (X2, Y2, and Z2 are real numbers greater than 0)), and gallium oxide (hereinafter, GaO$_{X3}$ (X3 is a real number greater than 0)) or gallium zinc oxide (hereinafter, Ga$_{X4}$Zn$_{Y4}$O$_{Z4}$ (X4, Y4, and Z4 are real numbers greater than 0)) to form a mosaic pattern, and InO$_{X1}$ or In$_{X2}$Zn$_{Y2}$O$_{Z2}$ forming the mosaic pattern is evenly distributed in the film.

That is, the CAC-OS is a composite metal oxide having a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to the element M in a second region, the first region has higher In concentration than the second region.

Note that IGZO is a common name, which may specify a compound containing In, Ga, Zn, and O. A typical example is a crystalline compound represented by InGaO$_3$(ZnO)$_{m1}$ (m1 is a natural number) or In$_{(1+x0)}$Ga$_{(1-x0)}$O$_3$(ZnO)$_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

Meanwhile, the CAC-OS relates to the material composition of a metal oxide. The CAC-OS refers to a composition in which, in the material composition containing In, Ga, Zn, and O, some regions that contain Ga as a main component and are observed as nanoparticles and some regions that contain In as a main component and are observed as nanoparticles are randomly dispersed in a mosaic pattern. Therefore, the crystal structure is a secondary element for the CAC-OS.

Note that in the CAC-OS, a stacked-layer structure including two or more films with different compositions is not included. For example, a two-layer structure of a film containing In as a main component and a film containing Ga as a main component is not included.

A boundary between the region containing GaO$_{X3}$ as a main component and the region containing In$_{X2}$Zn$_{Y2}$O$_{Z2}$ or InO$_{X1}$ as a main component is not clearly observed in some cases.

In the case where one or more kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, nanoparticle regions containing the selected metal element(s) as a main component are observed in part of a CAC-OS and nanoparticle regions containing In as a main component are observed in part of the CAC-OS, and these nanoparticle regions are randomly dispersed to form a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. The flow rate of the oxygen gas to the total flow rate of the deposition gas in deposition is preferably as low as possible, and for example, the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an Out-of-plane method, which is an X-ray diffraction (XRD) measurement method. That is, it is found from X-ray diffraction measurement that no alignment in the a-b plane direction and the c-axis direction is observed in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes an nc (nano-crystal) structure with no alignment in the plan-view direction and the cross-sectional direction.

Moreover, for example, it can be checked by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are phase-separated from each other to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of a metal oxide is exhibited. Accordingly, when the regions including $In_{X2}Zn_{Y2}O_{Z2}$ or $InO_{X1}$ as a main component are distributed in a metal oxide like a cloud, high field-effect mobility ($\mu$) can be achieved.

By contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in a metal oxide, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current (Ion) and high field-effect mobility ($\mu$) can be achieved.

A semiconductor element using a CAC-OS has high reliability. Thus, the CAC-OS is suitably used in a variety of semiconductor devices typified by a display.

Since a transistor including a CAC-OS in a semiconductor layer has high field-effect mobility and high driving capability, the use of the transistor in a driver circuit, typically a scan line driver circuit that generates a gate signal, enables a display device with a narrow frame width (also referred to as a narrow bezel) to be provided. Furthermore, the use of the transistor in a signal line driver circuit included in the display device (particularly in a demultiplexer connected to an output terminal of a shift register included in a signal line driver circuit) can reduce the number of wirings connected to the display device.

Furthermore, unlike a transistor including low-temperature polysilicon, the transistor including a CAC-OS in the semiconductor layer does not need a laser crystallization step. Thus, the manufacturing cost of a display device can be reduced, even when the display device is formed using a large substrate. In addition, the transistor including a CAC-OS in the semiconductor layer is preferably used for a driver circuit and a display unit in a large display device having high resolution such as ultra-high definition ("4K resolution", "4K2K", and "4K") or super high definition ("8K resolution", "8K4K", and "8K"), in which case writing can be performed in a short time and display defects can be reduced.

Alternatively, silicon may be used for a semiconductor in which a channel of a transistor is formed. As silicon, amorphous silicon may be used but silicon having crystallinity is particularly preferably used. For example, microcrystalline silicon, polycrystalline silicon, or single crystal silicon are preferably used. In particular, polycrystalline silicon can be formed at a temperature lower than that for single crystal silicon and has higher field-effect mobility and higher reliability than amorphous silicon.

Next, a structure that can be used for the conductive layer in the display device, or the conductive layer in the transistor, in particular, will be described.

Examples of materials that can be used for conductive layers of a variety of wirings and electrodes and the like included in the display device in addition to a gate, a source, and a drain of a transistor include metals such as aluminum, titanium, chromium, nickel, copper, yttrium, zirconium, molybdenum, silver, tantalum, and tungsten and an alloy containing such a metal as its main component. A single-layer structure or stacked-layer structure including a film containing any of these materials can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, a three-layer structure in which an aluminum film or a copper film is stacked over a molybdenum film or a molybdenum nitride film and a molybdenum film or a molybdenum nitride film is formed thereover, and the like can be given. Note that an oxide such as indium oxide, tin oxide, or zinc oxide may be used. Copper containing manganese is preferably used because it increases controllability of a shape by etching.

Next, a structure that can be used for the insulating layer in a display device will be described.

Examples of an insulating material that can be used for the insulating layers include, in addition to a resin such as acrylic or epoxy and a resin having a siloxane bond, an inorganic insulating material such as silicon oxide, silicon oxynitride, silicon nitride oxide, silicon nitride, or aluminum oxide.

The light-emitting element is preferably provided between a pair of insulating films with low water permeability. In that case, impurities such as water can be inhibited from entering the light-emitting element, and thus a decrease in device reliability can be inhibited.

Examples of the insulating film with low water permeability include a film containing nitrogen and silicon, such as a silicon nitride film and a silicon nitride oxide film, and a film containing nitrogen and aluminum, such as an aluminum nitride film. Alternatively, a silicon oxide film, a silicon oxynitride film, an aluminum oxide film, or the like may be used.

For example, the moisture vapor transmission rate of the insulating film with low water permeability is lower than or equal to $1\times10^{-5}$ [g/(m$^2\cdot$day)], preferably lower than or equal to $1\times10^{-6}$ [g/(m$^2\cdot$day)], further preferably lower than or equal to $1\times10^{-7}$ [g/(m$^2\cdot$day)], still further preferably lower than or equal to $1\times10^{-8}$ [g/(m$^2\cdot$day)].

The above is the description of the components.

Next, with regard to a structure example on the substrate 120 side, part of the manufacturing method of the display device will be described with reference to FIG. 14A, FIG. 14B to FIG. 16A and FIG. 16B.

Figure 14A:
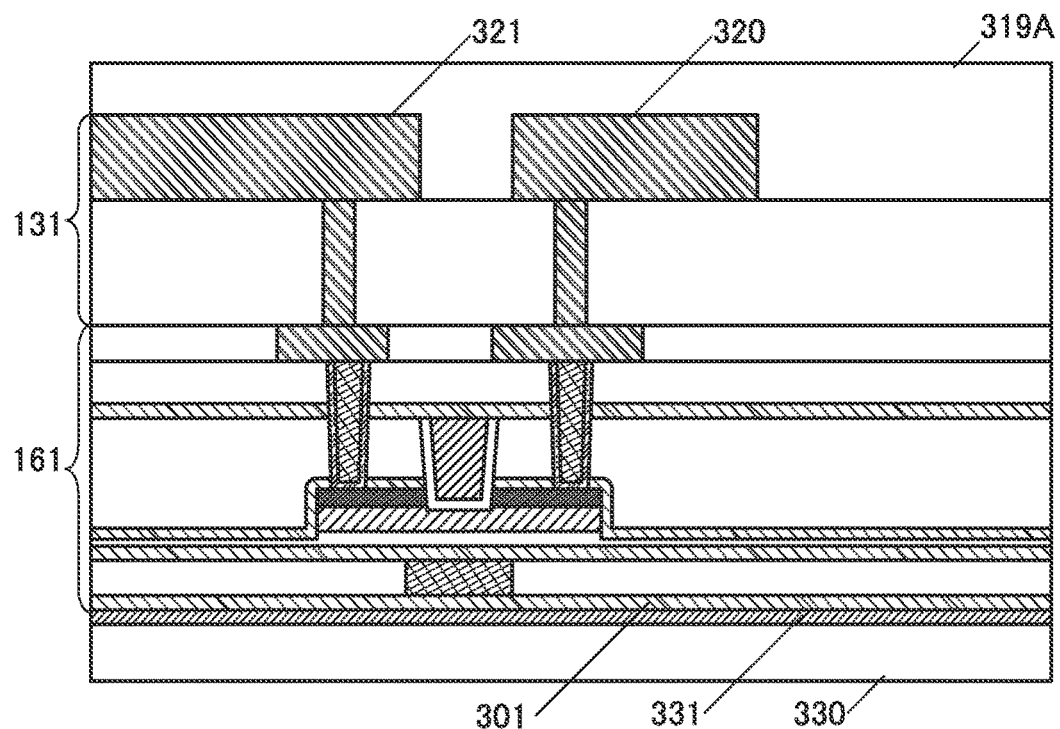
FIGS. 14A and 14B are diagrams illustrating a structure example of a display device.

First, a separation layer 331 is formed over a formation substrate 330, and the insulating layer 301 serving as a layer to be peeled is formed over the separation layer 331. The element layer 161 and the conductive layer 131 are provided over the insulating layer 301. In this state, the conductive layer 320 and the conductive layer 321 in the conductive layer 131 are covered with an insulating layer 319A, as shown in FIG. 14A. The insulating layer 319A corresponds to the insulating layer 319.

Figure 14B:
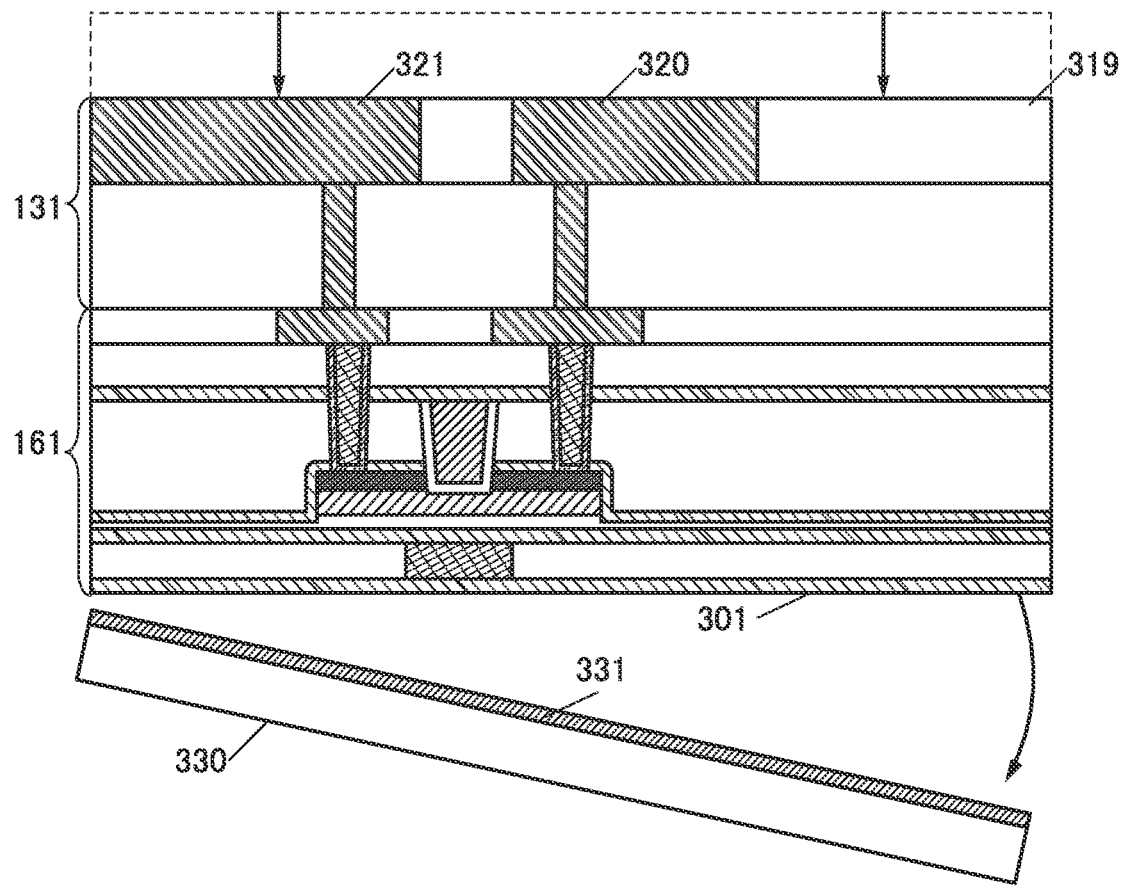

As shown in FIG. 14B, the separation layer 331 and the formation substrate 330 can be separated off, between the separation layer 331 and the insulating layer 301 serving as the layer to be peeled. Furthermore, as shown in FIG. 14B, the surface of the insulating layer 319A is subjected to polishing with the use of a technique such as CMP (chemical mechanical polishing) so that the conductive layer 320 and the conductive layer 321 are exposed and the surface is flattened.

For the separation between the separation layer 331 and the insulating layer 301 serving as the layer to be peeled, the interface between the separation layer 331 and the insulating layer 301 serving as the layer to be peeled may be permeated with a liquid such as water. A portion between the separation layer 331 and the insulating layer 301 serving as the layer to be separated absorbs a liquid through a capillary action; accordingly, an adverse effect on the element layer included on the insulating layer 301 (serving as the layer to be separated) side due to static electricity caused at the time of separation from the substrate (e.g., damage to a semiconductor element from static electricity) can be inhibited.

A tungsten film can be used as the separation layer 331, for example. With a tungsten film, a tungsten oxide film can be formed between the tungsten film and the layer to be separated by an oxidation method performed on the tungsten film, such as plasma treatment with a gas containing oxygen such as N$_2$O, annealing in a gas atmosphere containing oxygen, or forming a tungsten oxide film by a method such as sputtering in a gas atmosphere containing oxygen.

At the time of a separating and transferring process of the tungsten oxide film, it is preferable that tungsten oxide mainly have a composition in which the ratio of oxygen to tungsten is lower than 3. In a homologous series of tungsten oxides such as $W_nO_{(3n-1)}$ and $W_nO_{(3n-2)}$, shear is easily caused by overheating of a crystal optical shear plane therein. When the tungsten oxide film is formed by N$_2$O plasma treatment, the layer to be separated can be separated from the substrate with a weak force.

Alternatively, the tungsten oxide film can be directly formed without forming a tungsten film. For example, only the tungsten oxide film may be formed as the separation layer by performing plasma treatment on a sufficiently thin tungsten film with a gas containing oxygen, annealing a sufficiently thin tungsten film in a gas atmosphere containing oxygen, or forming the tungsten oxide film by a method such as sputtering in a gas atmosphere containing oxygen.

When the separation is caused at the interface between the tungsten film and the tungsten oxide film or inside the tungsten oxide film, the tungsten oxide film remains on the side of the layer to be separated, in some cases. Then, the remaining tungsten oxide film might adversely affect the properties of a transistor. Thus, a step of removing the tungsten oxide film is preferably performed after the step of separating the separation layer and the layer to be separated. Note that with the above method for separation from the substrate, N$_2$O plasma treatment need not necessarily be performed, which can eliminate the step of removing the tungsten oxide film. In that case, the device can be manufactured more easily.

A tungsten film with a thickness of greater than or equal to 0.1 nm and less than 200 nm over the substrate can be used, for example.

Other than a tungsten film, a film containing molybdenum, titanium, vanadium, tantalum, silicon, aluminum, or an alloy thereof may be used as the separation layer 331. Furthermore, a stacked-layer structure of such a film and its oxide film may be used. The separation layer 331 is not limited to an inorganic film, and an organic film such as polyimide may be used.

Figure 15A:
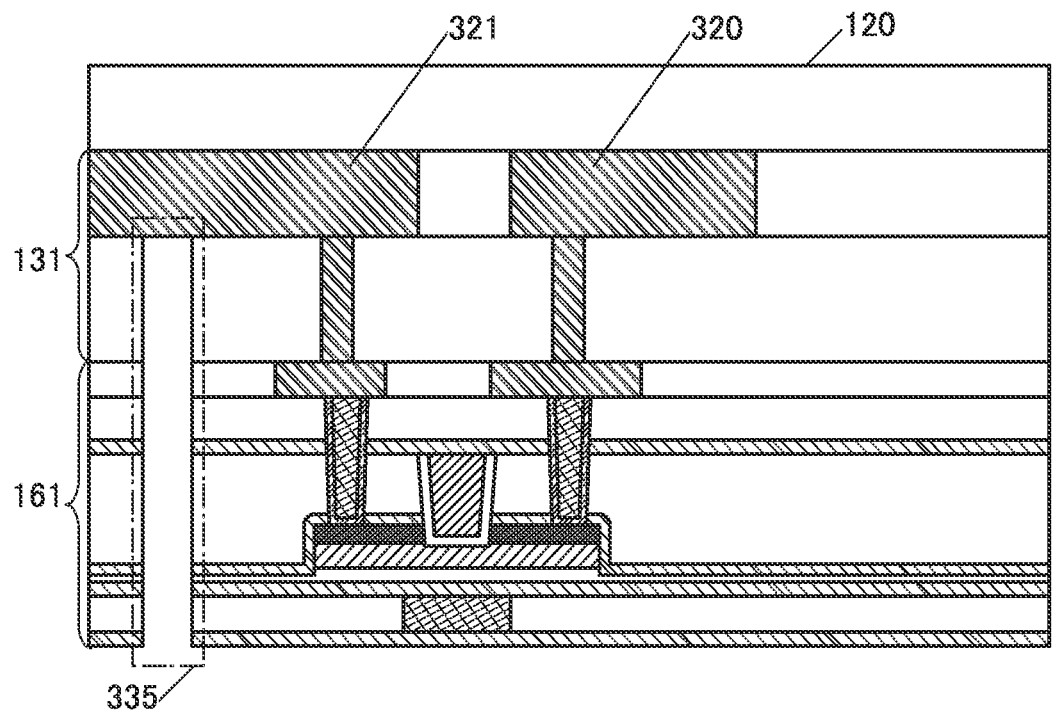
FIGS. 15A and 15B are diagrams illustrating a structure example of a display device.

As shown in FIG. 15A, the substrate 120 can be bonded to the planarized surface of the exposed conductive layer 320 and conductive layer 321. As mentioned above, a substrate having a light-transmitting property such as a glass substrate, a quartz substrate, a sapphire substrate, or a plastic substrate can be used as the substrate 120. With the substrate 120 and the substrate 110 being flexible substrates, the display device can be used as a flexible display device.

Figure 15B:
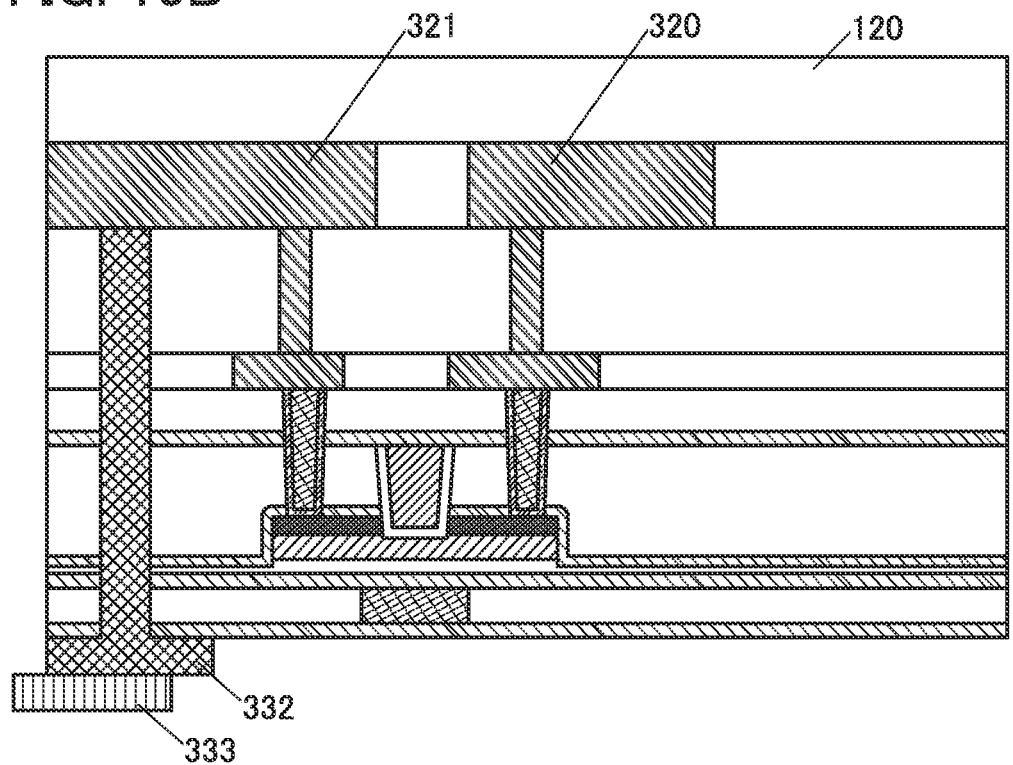

As shown in FIG. 15A, an opening 335 reaching the conductive layer 321 is provided in the element layer 161 and the conductive layer 131. As shown in FIG. 15B, the opening 335 is provided with a conductive layer 332 filling the opening 335, and an FPC 333 is provided on the insulating layer 301 side.

Figure 16A:
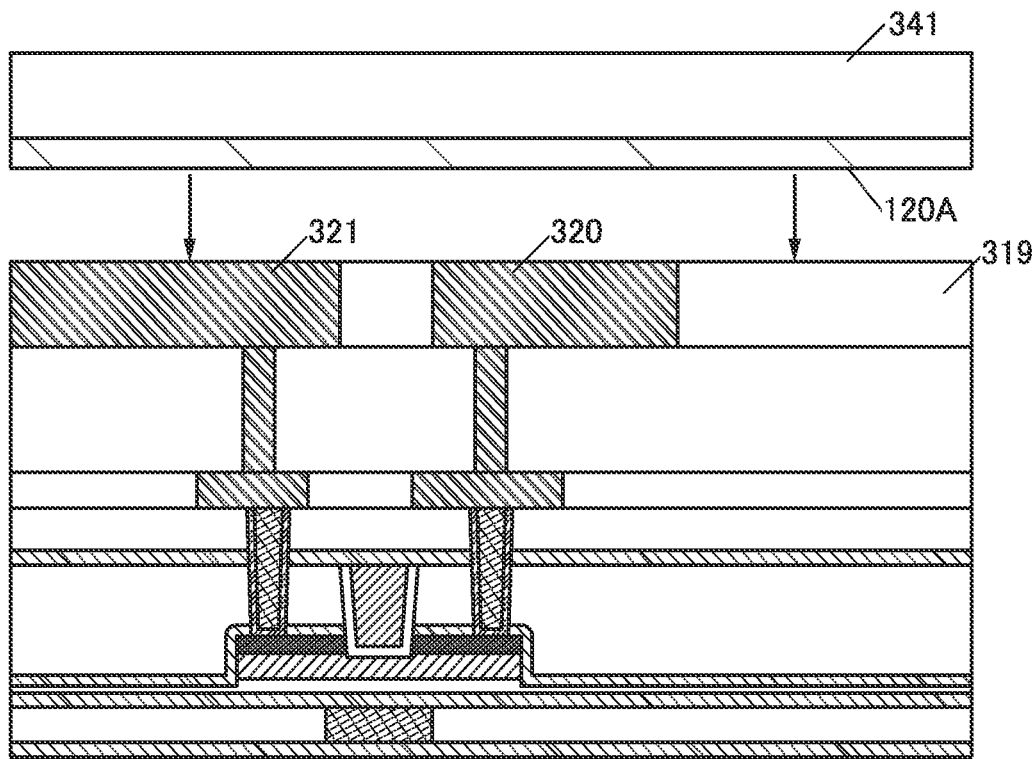
FIGS. 16A and 16B are diagrams illustrating a structure example of a display device.
Figure 16B:
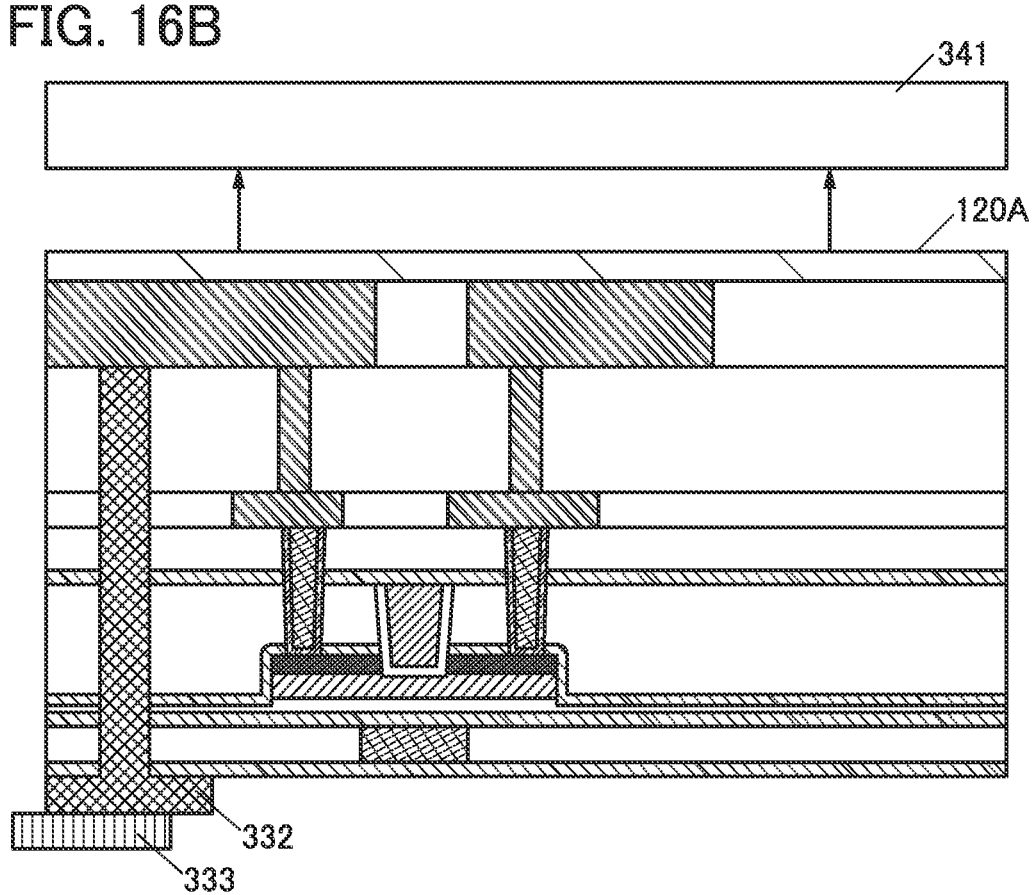

Note that a flexible substrate 120A provided on a support substrate 341 may be bonded to the planarized surface of the exposed conductive layer 320 and conductive layer 321, as shown in FIG. 16A. The support substrate 341 is separated from the flexible substrate 120A, as shown in FIG. 16B. Then, the conductive layers 332 and the FPC 333 are provided in a similar manner to FIG. 14B, whereby a foldable display device can be obtained.

Figure 17A:
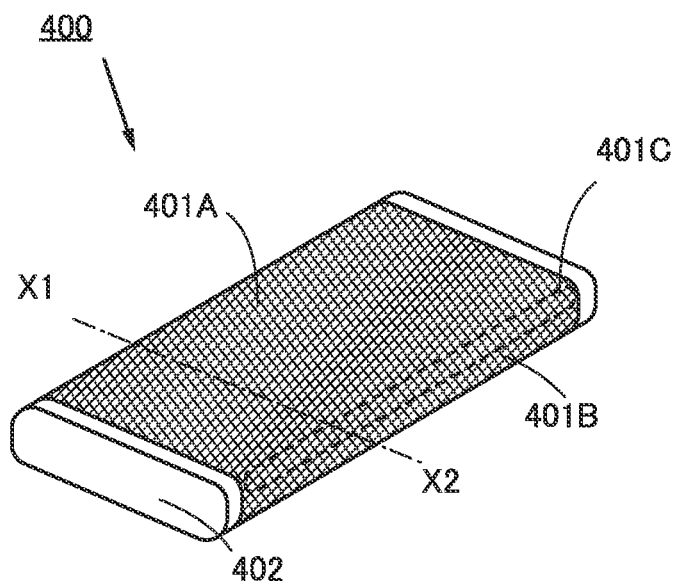
FIGS. 17A and 17B are diagrams illustrating a structure example of a display device.

Next, an example of an electronic device provided with a foldable display device will be described with reference to FIG. 17A and FIG. 17B. An electronic device 400 provided with the display device of one embodiment of the present invention has the display device including a region 401A, a region 401B, and a region 401C in a housing 402, as shown in FIG. 17A. Since the display device is foldable, the region 401B and the region 401C in a folded shape can be stored in the housing 402; thus, the region 401B and the region 401C can be placed in the bent portions.

Figure 17B:
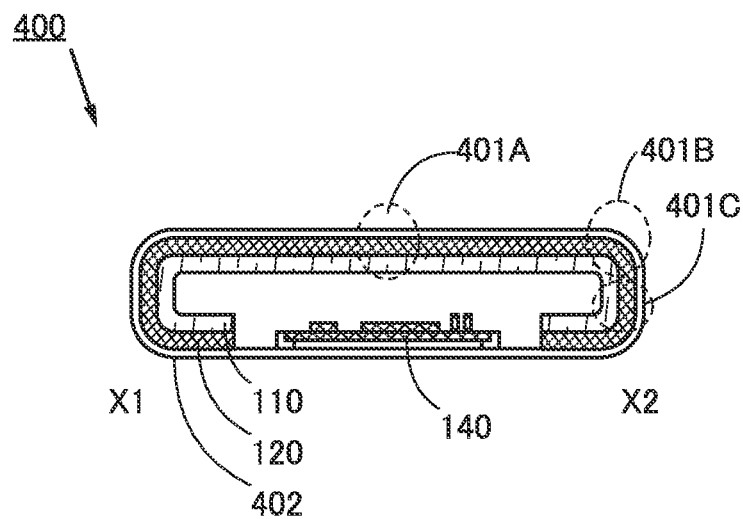

FIG. 17B is a cross-sectional view taken along a line X1-X2 of the electronic device 400 in FIG. 17A. As shown in FIG. 17B, in the electronic device 400, the display device with the folded substrate 110 and substrate 120 is stored in the housing 402. The substrate 140 connected to the display device is also provided in the housing 402. The housing 402 protects the display device and the like from external stress.

The region 401A, the region 401B, and the region 401C that correspond to a display unit can be placed not only in flat portions but also in bent portions of the housing 402. As described above in Embodiment 1, the conductive layer functioning as an antenna can be placed in the display unit.

Thus, a region where the conductive layer functioning as an antenna is placed can be increased.

Figure 18:
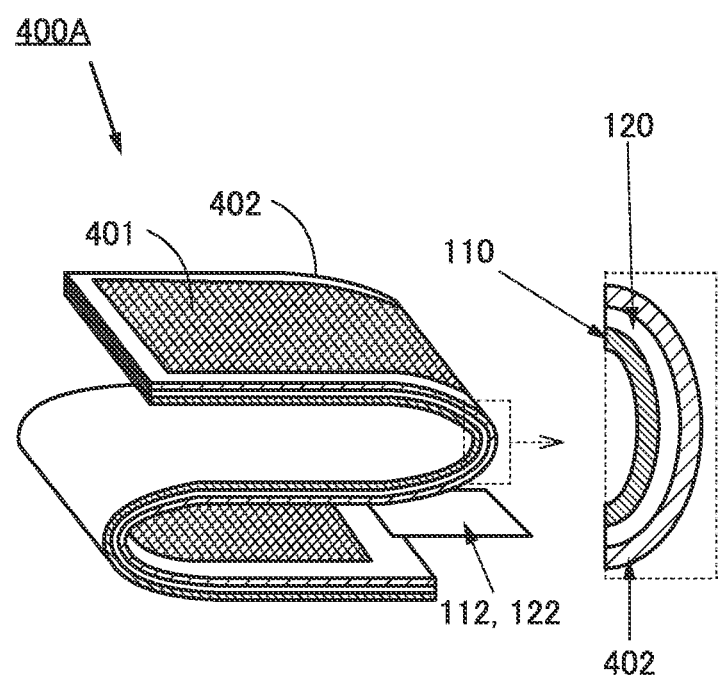
FIG. 18 is a diagram illustrating a structure example of a display device.

An example of an electronic device provided with a foldable display device, which is different from that in FIG. 17A and FIG. 17B, will be described with reference to FIG. 18. An electronic device 400A provided with the display device of one embodiment of the present invention includes a display device 401 stored in the foldable housing 402, as shown in FIG. 18. The housing 402 and the display device 401 are both foldable display devices, and thus the electronic device 400A can be a foldable display device.

As shown in FIG. 18, the electronic device 400A includes the substrate 110 and the substrate 120 which are provided along the housing 402. The display device 401 can be provided regardless of the shape of the electronic device 400A. Thus, a region where the conductive layer functioning as an antenna is placed can be increased.

Figure 19A:
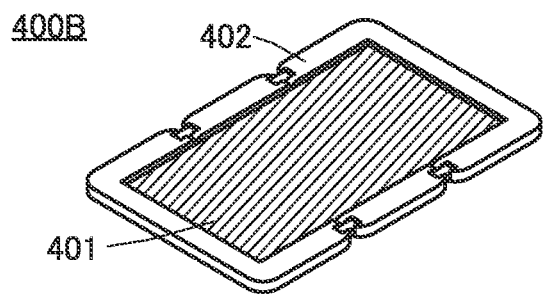
FIG. 19A to FIG. 19C are diagrams illustrating a structure example of a display device.
Figure 19B:
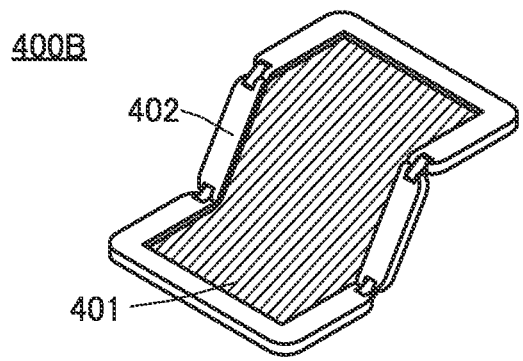
Figure 19C:
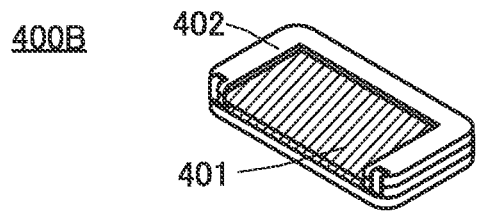

With the structure of the electronic device in FIG. 18, a structure that can be changed in shape is obtained. FIG. 19A to FIG. 19C show an electronic device different from those in FIGS. 17A, 17B, and 18. An electronic device 400B shown in FIG. 19A to FIG. 19C shows a structure where a housing and a display device are changed in shape.

The electronic device 400B shown in FIG. 19A can be changed in shape, through the shape in FIG. 19B, to the shape shown in FIG. 19C, whereby the area of the display unit of the display device can be increased or decreased. Thus, the number of conductive layers functioning as antennas to be arranged in lines over the substrate of the display device can be adjusted. For example, the receiving sensitivity can be improved when the electronic device is in a tablet-shape, as compared to the folded state. Thus, an electronic device that is variable in receiving sensitivity depending on the shape change can be obtained.

This embodiment can be implemented in combination with the other embodiments and example described in this specification as appropriate.

Embodiment 4

In this embodiment, a structure of a touch panel that can be used in the display device of one embodiment of the present invention will be described with reference to FIG. 20.

Figure 20:
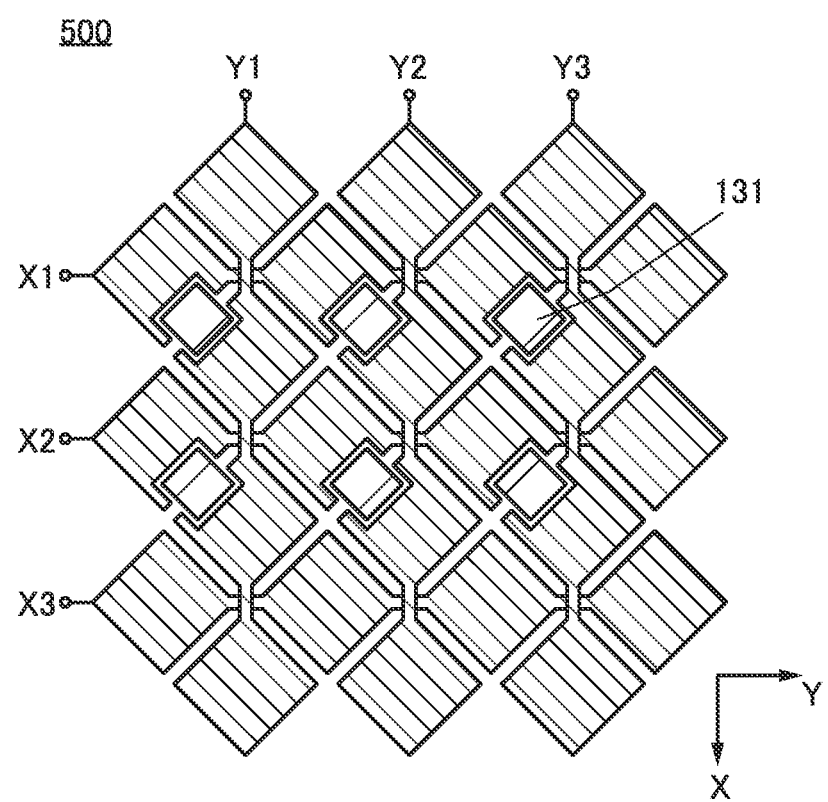
FIG. 20 is a diagram illustrating a structure example of a display device.

FIG. 20 is a top view of a touch panel 500 exemplified in this embodiment. Note that FIG. 20 shows main components for simplicity. Conductive layers are shown as electrodes with a hatching pattern in FIG. 20; however, the conductive layers each have an opening in a region overlapping with a pixel, in a similar manner to FIG. 3A. Thus, the conductive layers shown in FIG. 20 have a light-transmitting property.

The touch panel 500 includes conductive layers X1 to X3 functioning as electrodes provided in the X-direction and conductive layers Y1 to Y3 functioning as electrodes provided in the Y-direction, for example, in addition to the conductive layer 131 functioning as the antenna 130 described in Embodiment 1.

The conductive layers X1 to X3 and the conductive layers Y1 to Y3 are arranged so as to fill gaps between 131 functioning as the antennas 130 that are provided at regular intervals. With this structure, the area of a region where the conductive layer is not provided can be reduced, which enables unevenness in transmittance to be reduced and the substrate 120 side to have the touch sensor function. In addition, with the structure in which the conductive layer functioning as an electrode of the touch sensor is provided between adjacent antennas, formation of a portion where the thickness of a layer including the conductive layer is thin can be prevented. Thus, the coverage with a thin film formed after the formation of the conductive layers can be improved and the surface can be flat. Furthermore, owing to the uniform thickness of the conductive layer, luminance unevenness of light emitted from the pixels through the conductive layer can be reduced, so that the display device can achieve high display quality. The frequency of a signal used in the touch sensor is different from the frequency of a signal used in wireless communication; thus, the signals can be distinguished from each other.

As shown in FIG. 20, a plurality of conductive layers functioning as antennas can be placed between the conductive layers X1 to X3 and the conductive layers Y1 to Y3 functioning as the electrodes of the touch panel; thus, antennas with different shapes or different sizes can be provided. This enables radio signals with different frequencies to be transmitted or received. In addition, since a plurality of antennas with the same shape and the same size can be placed, beamforming technology with the antennas placed in an array can be used. Since the beamforming technology enables antenna directionality, radio wave propagation loss caused when communication frequency increases can be compensated for.

Although FIG. 20 illustrates the structure in which the conductive layers 131 in a square shape are regularly arranged, one embodiment of the present invention is not limited thereto. The shape of the conductive layers 131 may be a circle, a triangle, a pentagon, a hexagon, an octagon, or the like, for example.

The conductive layers X1 to X3 and the conductive layers Y1 to Y3 functioning as electrodes of the touch panel function as electrodes of a capacitive touch sensor, for example. Examples of the capacitive touch sensor include a surface capacitive touch sensor and a projected capacitive touch sensor. Examples of the projected capacitive touch sensor include a self-capacitive touch sensor and a mutual-capacitive touch sensor, which differ mainly in the driving method. The use of a mutual-capacitive touch sensor is preferred because multiple points can be sensed simultaneously.

In the case of a projected self-capacitive touch sensor, a pulse voltage is applied to each of the conductive layers X1 to X3 and the conductive layers Y1 to Y3 so that they are scanned, and the value of a current flowing in themselves is sensed. The amount of current is changed when an object approaches, and therefore, positional information of the object can be obtained by sensing the difference between the values. In the case of a projected mutual-capacitive touch sensor, a pulse voltage is applied to the conductive layers X1 to X3 or the conductive layers Y1 to Y3 so that either one of the conductive layers X1 to X3 or the conductive layers Y1 or Y3 are scanned, and a current flowing in the other is sensed to obtain positional information of the object.

Note that in a portion where the conductive layers X1 to X3 and the conductive layers Y1 to Y3 intersect with each other, a connection is preferably made through a conductive layer provided in another layer. The area of the portion where the conductive layers X1 to X3 and the conductive layers Y1 to Y3 intersect with each other is preferably as small as possible.

In the case of a projected self-capacitive touch sensor, a pulse voltage is applied to each of the conductive layers X1 to X3 and the conductive layers Y1 to Y3 so that they are scanned, and the value of a current flowing in themselves is sensed. The amount of current is changed when an object approaches, and therefore, positional information of the object can be obtained by sensing the difference between the values. In the case of a projected mutual-capacitive touch sensor, a pulse voltage is applied to the conductive layers X1 to X3 or the conductive layers Y1 to Y3 so that either one of the conductive layers X1 to X3 or the conductive layers Y1 or Y3 are scanned, and a current flowing in the other is sensed to enable positional information of the object to be obtained.

Note that this embodiment can be combined with any of the other embodiments in this specification as appropriate.

Embodiment 5

In this embodiment, examples of an electronic device including the above display device will be described with reference to FIG. 21A to FIG. 21F.

Examples of electronic devices including the display device of one embodiment of the present invention include display devices of televisions, monitors, and the like; lighting devices; desktop or laptop personal computers; word processors; image reproduction devices that reproduce still images and moving images stored in recording media such as DVD (Digital Versatile Disc); portable CD players; radios; tape recorders; headphone stereos; stereos; table clocks; wall clocks; cordless phone handsets; transceivers; mobile phones; car phones; portable game machines; tablet terminals; large-sized game machines such as pachinko machines; calculators; portable information terminals; electronic notebooks; e-book readers; electronic translators; audio input devices; video cameras; digital still cameras; electric shavers; high-frequency heating appliances such as microwave ovens; electric rice cookers; electric washing machines; electric vacuum cleaners; water heaters; electric fans; hair dryers; air-conditioning systems such as air conditioners, humidifiers, and dehumidifiers; dishwashers; dish dryers; clothes dryers; futon dryers; electric refrigerators; electric freezers; electric refrigerator-freezers; freezers for preserving DNA; flashlights; tools such as chain saws; smoke detectors; and medical equipment such as dialyzers. Other examples include industrial equipment such as guide lights, traffic lights, conveyor belts, elevators, escalators, industrial robots, power storage systems, and power storage devices for leveling the amount of power supply and smart grid.

In addition, moving objects and the like driven by electric motors using electric power from the power storage devices are also included in the category of electronic devices. Examples of the moving objects include electric vehicles (EVs), hybrid electric vehicles (HEVs) that include both an internal-combustion engine and a motor, plug-in hybrid electric vehicles (PHEVs), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The display device of one embodiment of the present invention can be used for display units and communication devices in any of the electronic devices.

The electronic devices may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), for example.

The electronic device can have a variety of functions. For example, the electronic device can have a function of displaying a variety of data (a still image, a moving image, a text image, and the like) on the display unit, a touch panel function, a function of displaying a calendar, date, time, and the like, a function of executing a variety of software (programs), a wireless communication function, and a function of reading out a program or data stored in a recording medium.

FIG. 21A to FIG. 21F show examples of an electronic device.

Figure 21A:
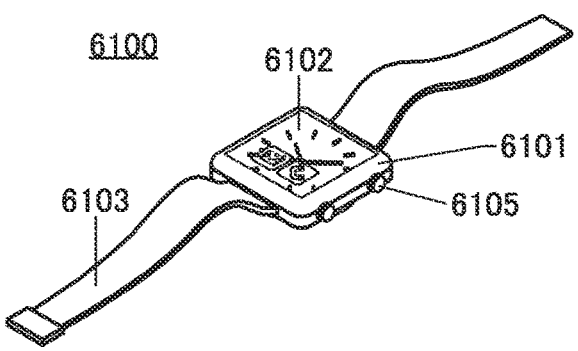
FIG. 21A to FIG. 21F are diagrams illustrating structure examples of electronic devices.

FIG. 21A shows an example of a watch-type portable information terminal. A portable information terminal 6100 includes a housing 6101, a display unit 6102, a band 6103, operation buttons 6105, and the like. The use of the display device of one embodiment of the present invention in the display unit 6102 enables a reduction in size of the portable information terminal 6100.

Figure 21B:
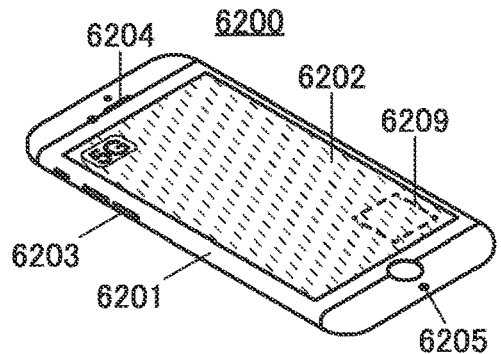

FIG. 21B shows an example of a portable telephone. A portable information terminal 6200 includes a display unit 6202 incorporated in a housing 6201, operation buttons 6203, a speaker 6204, a microphone 6205, and the like.

The portable information terminal 6200 further includes a fingerprint sensor 6209 in a region overlapping with the display unit 6202. The fingerprint sensor 6209 may be an organic optical sensor. Since a fingerprint differs between individuals, the fingerprint sensor 6209 can perform personal authentication when acquiring fingerprint patterns. As a light source for acquiring fingerprint patterns with the fingerprint sensor 6209, light emitted from the display unit 6202 can be used.

The use of the display device of one embodiment of the present invention in the display unit 6202 enables a reduction in size of the portable information terminal 6200.

Figure 21C:
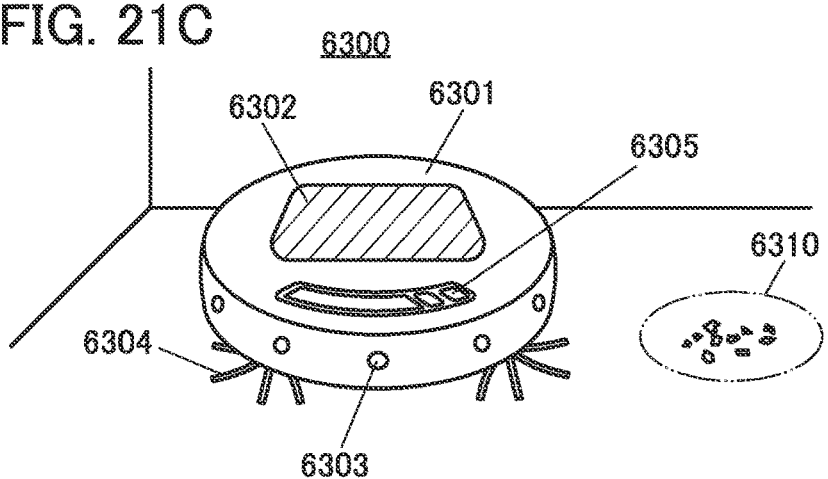

FIG. 21C shows an example of a cleaning robot. A cleaning robot 6300 includes a display unit 6302 placed on the top surface of a housing 6301, a plurality of cameras 6303 placed on the side surface of the housing 6301, a brush 6304, operation buttons 6305, a variety of sensors, and the like. Although not shown, the cleaning robot 6300 is provided with a tire, an inlet, and the like. The cleaning robot 6300 is self-propelled, detects dust 6310, and sucks up the dust through the inlet provided on the bottom surface.

For example, the cleaning robot 6300 can determine whether there is an obstacle such as a wall, furniture, or a step by analyzing images taken by the cameras 6303. In the case where the cleaning robot 6300 detects an object, e.g., wiring, that is likely to be caught in the brush 6304 by image analysis, the rotation of the brush 6304 can be stopped. The use of the display device of one embodiment of the present invention in the display unit 6302 enables a reduction in size of the cleaning robot 6300.

Figure 21D:
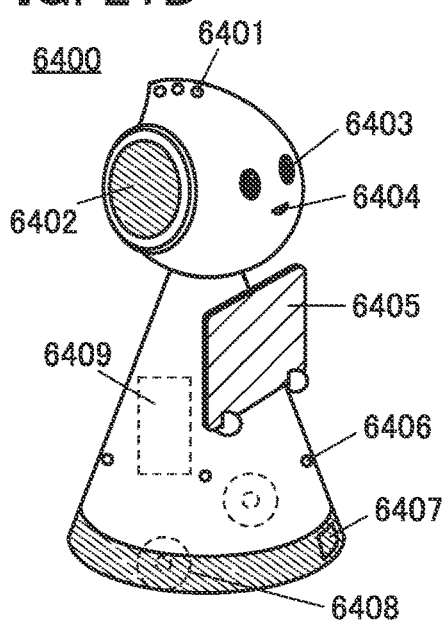

FIG. 21D shows an example of a robot. A robot 6400 shown in FIG. 21D includes an arithmetic device 6409, an illuminance sensor 6401, a microphone 6402, an upper camera 6403, a speaker 6404, a display unit 6405, a lower camera 6406, an obstacle sensor 6407, and a moving mechanism 6408.

The microphone 6402 has a function of detecting a speaking voice of a user, an environmental sound, and the like. The speaker 6404 has a function of outputting sound. The robot 6400 can communicate with a user using the microphone 6402 and the speaker 6404.

The display unit 6405 has a function of displaying various kinds of information. The robot 6400 can display information desired by a user on the display unit 6405. The display unit 6405 may be provided with a touch panel. Moreover, the display unit 6405 may be a detachable information terminal, in which case charging and data communication can be performed when the display unit 6405 is set at the home position of the robot 6400.

The display unit 6405 includes an illuminance sensor, a camera, an operation button, or the like, and the display unit 6405 can be operated by a touch with a stylus pen or the like. The functions of the display unit 6405 include a voice call, a video call, e-mailing, an appointment organizer, Internet communication, music reproduction, and the like.

The upper camera 6403 and the lower camera 6406 have a function of taking an image of the surroundings of the robot 6400. The obstacle sensor 6407 can detect an obstacle in the direction where the robot 6400 advances with the moving mechanism 6408. The robot 6400 can move safely by recognizing the surroundings with the upper camera 6403, the lower camera 6406, and the obstacle sensor 6407. The light-emitting device of one embodiment of the present invention can be used for the display unit 6405.

The use of the display device of one embodiment of the present invention in the display unit 6405 enables a reduction in size of the robot 6400.

Figure 21E:
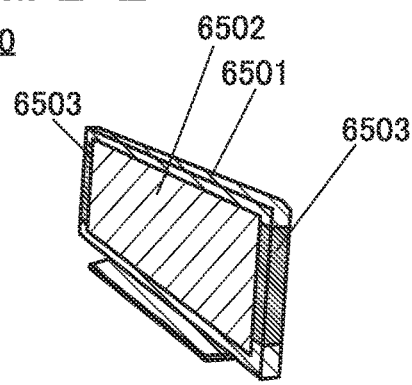

FIG. 21E shows an example of a television receiver. A television receiver 6500 shown in FIG. 21E includes a housing 6501, a display unit 6502, a speaker 6503, and the like.

The use of the display device of one embodiment of the present invention in the display unit 6502 enables a reduction in size of the television receiver 6500.

Figure 21F:
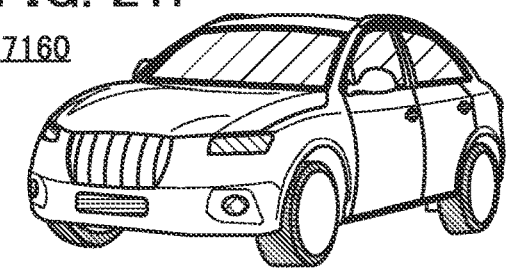

FIG. 21F shows an example of an automobile. An automobile 7160 includes an engine, tires, a brake, a steering gear, a camera, and the like. The automobile 7160 further includes the display device of one embodiment of the present invention inside. The use of the display device of one embodiment of the present invention in the automobile 7160 enables the automobile 7160 to function as an IoT device and a reduction in size of the display device.

The structures, the configurations, the methods, and the like described in this example can be combined as appropriate with any of the structures, the configurations, the methods, and the like described in the other embodiments and examples.

The description of the above embodiments and each structure in the embodiments are noted below.

One embodiment of the present invention can be constituted by combining, as appropriate, the structure described in each embodiment with any of the structures described in the other embodiments and Example. In addition, in the case where a plurality of structure examples are described in one embodiment, the structure examples can be combined as appropriate.

Note that content (or may be part of the content) described in one embodiment can be applied to, combined with, or replaced with another content (or may be part of the content) described in the embodiment and/or content (or may be part of the content) described in another embodiment or other embodiments.

Note that in each embodiment, content described in the embodiment is content described using a variety of drawings or content described with text disclosed in the specification.

Note that by combining a drawing (or may be part thereof) described in one embodiment with another part of the diagram (or may be part thereof) described in the embodiment, and/or a drawing (or may be part thereof) described in another embodiment or other embodiments, much more drawings can be formed.

In addition, in this specification and the like, components are classified on the basis of the functions, and shown as blocks independent of one another in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in the specification, and the description can be changed appropriately depending on the situation.

Furthermore, in the drawings, the size, the layer thickness, or the region is shown with given magnitude for description convenience. Therefore, the size, the layer thickness, or the region is not necessarily limited to the illustrated scale. Note that the drawings are schematically shown for clarity, and embodiments of the present invention are not limited to shapes, values or the like shown in the drawings. For example, fluctuation in signal, voltage, or current due to noise, fluctuation in signal, voltage, or current due to difference in timing, or the like can be included.

Furthermore, the positional relation between components illustrated in the drawings and the like is relative. Therefore, when the components are described with reference to drawings, terms for describing the positional relation, such as "over" and "under", may be used for convenience. The positional relation of the components is not limited to that described in this specification and can be explained with other terms as appropriate depending on the situation.

In this specification and the like, one of a source and a drain is expressed as "one of a source or a drain" (or a first electrode or a first terminal) and the other of the source and the drain is expressed as "the other of the source or the drain" (or a second electrode or a second terminal) in the description of the connection relationship of a transistor. This is because the source and the drain of the transistor change depending on the structure, operating conditions, or the like of the transistor. Note that the source or the drain of the transistor can also be referred to as a source (drain) terminal, a source (drain) electrode, or the like as appropriate depending on the situation.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

Furthermore, in this specification and the like, "voltage" and "potential" can be interchanged with each other as appropriate. The voltage refers to a potential difference from a reference potential, and when the reference potential is a ground voltage, for example, the voltage can be rephrased into the potential. The ground potential does not necessarily mean 0 V. Note that potentials are relative values, and a potential applied to a wiring or the like is sometimes changed depending on the reference potential.

In this specification and the like, a node can be referred to as a terminal, a wiring, an electrode, a conductive layer, a conductor, an impurity region, or the like depending on the circuit structure, the device structure, or the like. Furthermore, a terminal, a wiring, or the like can be referred to as a node.

In this specification and the like, the expression "A and B are connected" means the case where A and B are electrically connected. Here, the expression "A and B are electrically connected" means connection that enables electric signal transmission between A and B in the case where an object (that refers to an element such as a switch, a transistor element, or a diode, a circuit including the element and a wiring, or the like) exists between A and B. Note that the case where A and B are electrically connected includes the case where A and B are directly connected. Here, the expression "A and B are directly connected" means connection that enables electric signal transmission between A and B through a wiring (or an electrode) or the like, not through the above object. In other words, direct connection refers to connection that can be regarded as the same circuit diagram when indicated as an equivalent circuit.

In this specification and the like, a switch has a function of controlling whether current flows or not by being in a conduction state (an on state) or a non-conduction state (an off state). Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap with each other or a region where a channel is formed.

Note that in this specification and the like, the terms such as "film" and "layer" can be interchanged with each other depending on the case or according to circumstances. For example, the term "conductive layer" can be changed into the term "conductive film" in some cases. As another example, the term "insulating film" can be changed into the term "insulating layer" in some cases.

REFERENCE NUMERALS

10: electronic device, 11: application processor, 12: baseband processor, 14: memory, 15: battery, 16: power management IC, 17: display unit, 18: camera unit, 19: operation input unit, 20: audio IC, 21: microphone, 22: speaker, 31: low noise amplifier, 32: mixer, 33: low-pass filter, 33B: sub-pixel, 33G: sub-pixel, 33R: sub-pixel, 33Y: sub-pixel, 34: variable gain amplifier, 35: analog-digital converter circuit, 36: interface unit, 40: oscillation circuit, 41: digital-analog converter circuit, 42: variable gain amplifier, 43: low-pass filter, 44: mixer, 45: power amplifier, 50: housing, 100: display device, 110: substrate, 111: display unit, 112: FPC, 113: IC, 114: wiring, 115: circuit, 116: pixel, 120: substrate, 120A: flexible substrate, 122: FPC, 130: antenna, 130_N: antenna, 130_1: antenna, 131: conductive layer, 131A: conductive layer, 131D: conductive layer, 131P: conductive layer, 131Q: conductive layer, 132: conductive layer, 133: opening, 133A: opening, 133B: opening, 133C: opening, 134: cutout portion, 135: protrusion, 140: substrate, 141: integrated circuit, 142: amplifier, 160: region, 161: element layer, 162: opening, 163: wiring, 164: transistor, 170: display unit, 201: transistor, 202: light-emitting element, 203: transistor, 211: insulating layer, 213: conductive layer, 214: insulating layer, 215: insulating layer, 216: semiconductor layer, 217: conductive layer, 218: insulating layer, 219: insulating layer, 220: insulating layer, 221: conductive layer, 222: conductive layer, 223: conductive layer, 224: insulating layer, 225: insulating layer, 226: conductive layer, 228: EL layer, 230: conductive layer, 231: insulating layer, 232: insulating layer, 301: insulating layer, 302: insulating layer, 303: conductive layer, 304: insulating layer, 305: semiconductor layer, 306: conductive layer, 307: insulating layer, 308: insulating layer, 309: insulating layer, 310: conductive layer, 313: conductive layer, 314: conductive layer, 315: insulating layer, 316: conductive layer, 317: insulating layer, 318: conductive layer, 319: insulating layer, 319A: insulating layer, 320: conductive layer, 321: conductive layer, 330: formation substrate, 331: separation layer, 332: conductive layer, 333: FPC, 335: opening, 341: support substrate, 400: electronic device, 400A: electronic device, 400B: electronic device, 401: display device, 401A: region, 401B: region, 401C: region, 402: housing, 6100: portable information terminal, 6101: housing, 6102: display unit, 6103: band, 6105: operation button, 6200: portable information terminal, 6201: housing, 6202: display unit, 6203: operation button, 6204: speaker, 6205: microphone, 6209: fingerprint sensor, 6300: cleaning robot, 6301: housing, 6302: display unit, 6303: camera, 6304: brush, 6305: operation button, 6310: dust, 6400: robot, 6401: illuminance sensor, 6402: microphone, 6403: upper camera, 6404: speaker, 6405: display unit, 6406: lower camera, 6407: obstacle sensor, 6408: moving mechanism, 6409: arithmetic device, 6500: television receiver, 6501: housing, 6502: display unit, 6503: speaker, 7160: automobile

The invention claimed is:
1. A display device comprising:
a first substrate with a plurality of pixels comprising a display element; and
a second substrate comprising a first conductive layer, a second conductive layer, a third conductive layer, a fourth conductive layer, and a fifth conductive layer,
wherein the first conductive layer is configured to be an antenna capable of transmitting and receiving a radio signal, and comprises a plurality of first openings,
wherein the second conductive layer is configured to be an antenna capable of transmitting and receiving a radio signal, and comprises a plurality of second openings,
wherein the third conductive layer is configured to be an antenna capable of transmitting and receiving a radio signal, and comprises a plurality of third openings,
wherein the fourth conductive layer is configured to be an antenna capable of transmitting and receiving a radio signal, and comprises a plurality of fourth openings,
wherein the fifth conductive layer is not configured to be an antenna capable of transmitting and receiving a radio signal, and comprises a plurality of fifth openings,
wherein the pixels and the first openings each comprise a first region where the pixel and the first opening overlap with each other,
wherein the pixels and the second openings each comprise a second region where the pixel and the second opening overlap with each other,
wherein the pixels and the third openings each comprise a third region where the pixel and the third opening overlap with each other,
wherein the pixels and the fourth openings each comprise a fourth region where the pixel and the fourth opening overlap with each other, and wherein the pixels and the fifth openings each comprise a fifth region where the pixel and the fifth opening overlap with each other.

2. The display device according to claim 1, wherein the second substrate is a glass substrate.

3. The display device according to claim 1, wherein the second substrate is a flexible substrate.

4. The display device according to claim 1, wherein each of the first conductive layer, the second conductive layer, the third conductive layer, and the fourth conductive layer has a same shape and a same size.

5. The display device according to claim 1, wherein in a plan view, a first part of the fifth conductive layer is positioned between the first conductive layer and the second conductive layer, wherein in a plan view, a second part of the fifth conductive layer is positioned between the second conductive layer and the third conductive layer, wherein in a plan view, a third part of the fifth conductive layer is positioned between the third conductive layer and the fourth conductive layer, and wherein in a plan view, a fourth part of the fifth conductive layer is positioned between the fourth conductive layer and the first conductive layer.

6. The display device according to claim 5, wherein in a plan view, a fifth part of the fifth conductive layer is positioned between the first part of the fifth conductive layer and the third part of the fifth conductive layer, and wherein in a plan view, the fifth part of the fifth conductive layer is positioned between the second part of the fifth conductive layer and the fourth part of the fifth conductive layer.

* * * * *